(12) United States Patent
Park et al.

(10) Patent No.: US 10,529,769 B2
(45) Date of Patent: Jan. 7, 2020

(54) METHOD OF MANUFACTURING A COLOR IMAGE SENSOR HAVING AN OPTICALLY SENSITIVE MATERIAL WITH MULTIPLE THICKNESSES

(71) Applicant: InVisage Technologies Inc., Newark, CA (US)

(72) Inventors: Jae Park, Newark, CA (US); Emanuele Mandelli, Mountain View, CA (US)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 0 days.

(21) Appl. No.: 15/953,459

(22) Filed: Apr. 15, 2018

(65) Prior Publication Data

US 2018/0301497 A1    Oct. 18, 2018

Related U.S. Application Data

(62) Division of application No. 14/808,368, filed on Jul. 24, 2015, now Pat. No. 9,978,801.

(Continued)

(51) Int. Cl.
*H01L 27/146* (2006.01)
*H04N 5/33* (2006.01)
*H04N 9/04* (2006.01)

(52) U.S. Cl.
CPC .. *H01L 27/14645* (2013.01); *H01L 27/14627* (2013.01); *H01L 27/14665* (2013.01); *H01L 27/14667* (2013.01); *H01L 27/14685* (2013.01); *H04N 5/332* (2013.01); *H04N 9/045* (2013.01); *H01L 2224/48091* (2013.01); *H04N 2209/047* (2013.01)

(58) Field of Classification Search
CPC .......... H01L 27/14665–14676; H01L 27/14645–14652; H01L 27/14868–14881; H01L 27/14685; H01L 27/14667; H01L 27/14669; H01L 27/14676
See application file for complete search history.

(56) References Cited

U.S. PATENT DOCUMENTS 5,671,914 A * 9/1997 Kalkhoran ........ H01L 27/14645
257/437
7,091,466 B2   8/2006 Bock
(Continued)

*Primary Examiner* — Younes Boulghassoul
(74) *Attorney, Agent, or Firm* — Kligler & Associates Patent Attorneys Ltd

(57) ABSTRACT

In various embodiments, image sensors and methods of making images sensors are disclosed. In an embodiment, an image sensor includes a first pixel region having a pixel electrode, an optically sensitive material of a first thickness, and a counterelectrode. The images sensor also includes a second pixel region comprising a pixel electrode, an optically sensitive material of a second thickness, and a counterelectrode. The first pixel region is configured to detect light in a first spectral band and the second pixel region is configured to detect light in a second spectral band. The first and second spectral bands include an overlapping spectral range. The second spectral band also includes a spectral range that is substantially undetectable by the first pixel region. Other image sensors and methods of making images sensors are also disclosed.

4 Claims, 20 Drawing Sheets

Related U.S. Application Data

(60) Provisional application No. 62/029,014, filed on Jul. 25, 2014.

(56) References Cited

U.S. PATENT DOCUMENTS

| | | | |
|---|---|---|---|
| 7,319,218 B2 | 1/2008 | Krymski | |
| 7,525,083 B2 * | 4/2009 | Jaeger | H01L 31/02162 250/208.1 |
| 7,745,773 B1 | 6/2010 | Merrill | |
| 7,923,801 B2 * | 4/2011 | Tian | H01L 27/14603 257/440 |
| 8,546,737 B2 | 10/2013 | Tian et al. | |
| 9,538,102 B2 | 1/2017 | Tian et al. | |
| 2004/0069930 A1 | 4/2004 | Zarnowski et al. | |
| 2005/0103983 A1 * | 5/2005 | Yamaguchi | H01L 27/14621 250/214.1 |
| 2005/0205901 A1 * | 9/2005 | Suzuki | H01L 27/14609 257/291 |
| 2006/0145223 A1 * | 7/2006 | Ryu | H01L 27/14621 257/294 |
| 2007/0030366 A1 | 2/2007 | Compton | |
| 2007/0122935 A1 * | 5/2007 | Kasano | H01L 27/14621 438/73 |
| 2007/0125934 A1 * | 6/2007 | Matthews | H01L 27/14667 250/208.1 |
| 2008/0079807 A1 | 4/2008 | Inuiya et al. | |
| 2008/0265349 A1 * | 10/2008 | Kasano | G03B 11/00 257/432 |
| 2009/0115014 A1 * | 5/2009 | Kim | H01L 27/14636 257/458 |
| 2009/0195681 A1 | 8/2009 | Compton et al. | |
| 2009/0322917 A1 | 12/2009 | Kyogoku et al. | |
| 2010/0309351 A1 | 12/2010 | Smith et al. | |
| 2011/0215433 A1 * | 9/2011 | Kokubun | H01L 27/14609 257/448 |
| 2012/0200852 A1 * | 8/2012 | Tejada | G01J 3/12 356/326 |
| 2013/0168563 A1 * | 7/2013 | Kim | G01T 1/16 250/370.06 |
| 2013/0240708 A1 * | 9/2013 | Kokubun | H01L 31/02162 250/208.1 |

* cited by examiner

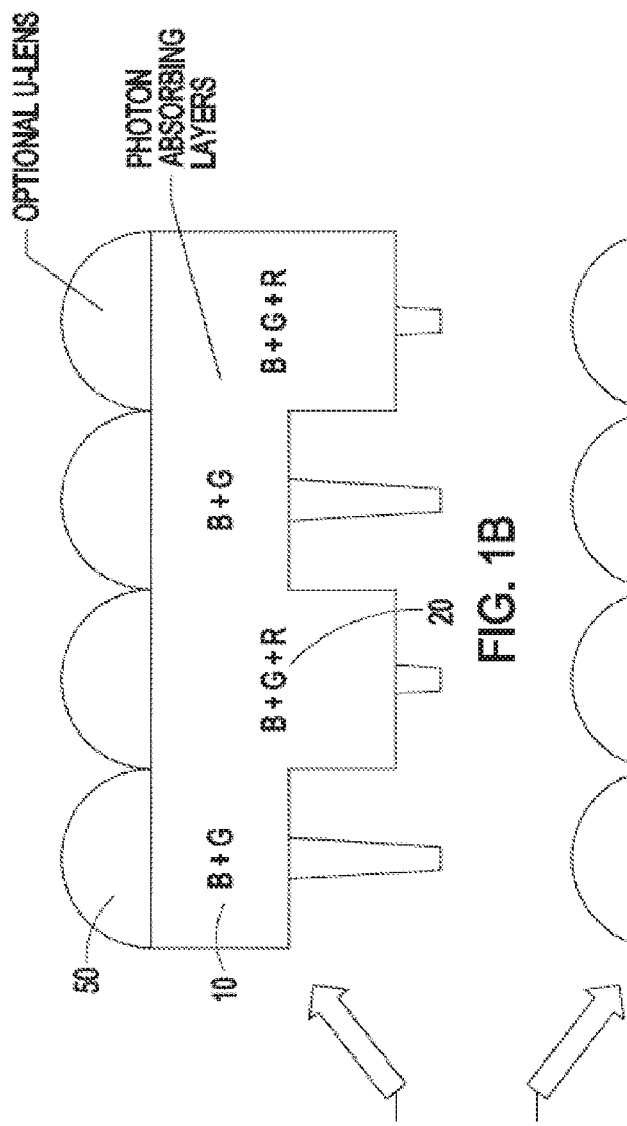
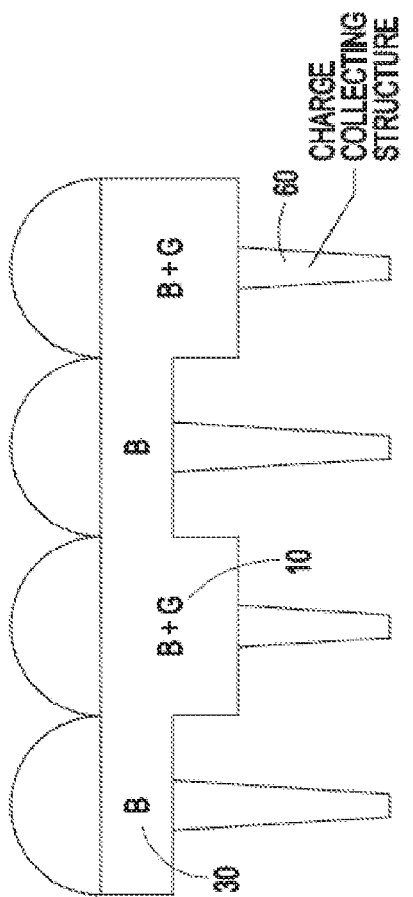
FIG. 1A
FIG. 1B
FIG. 1C

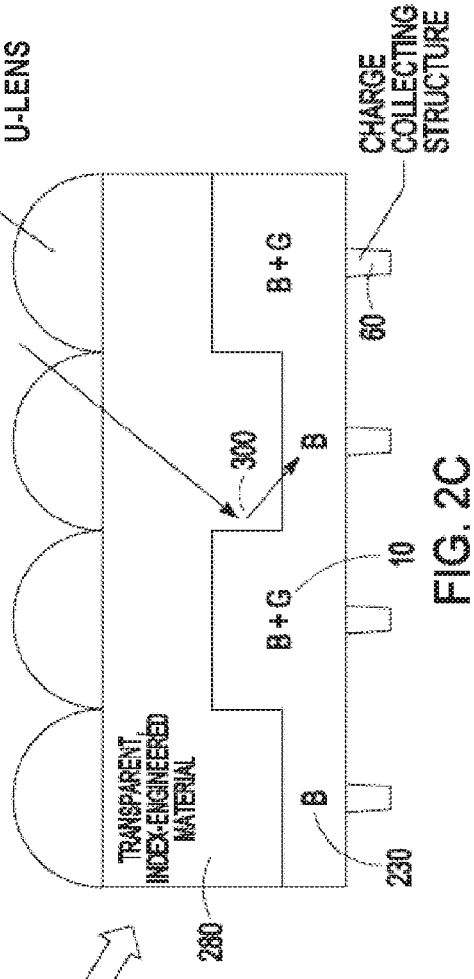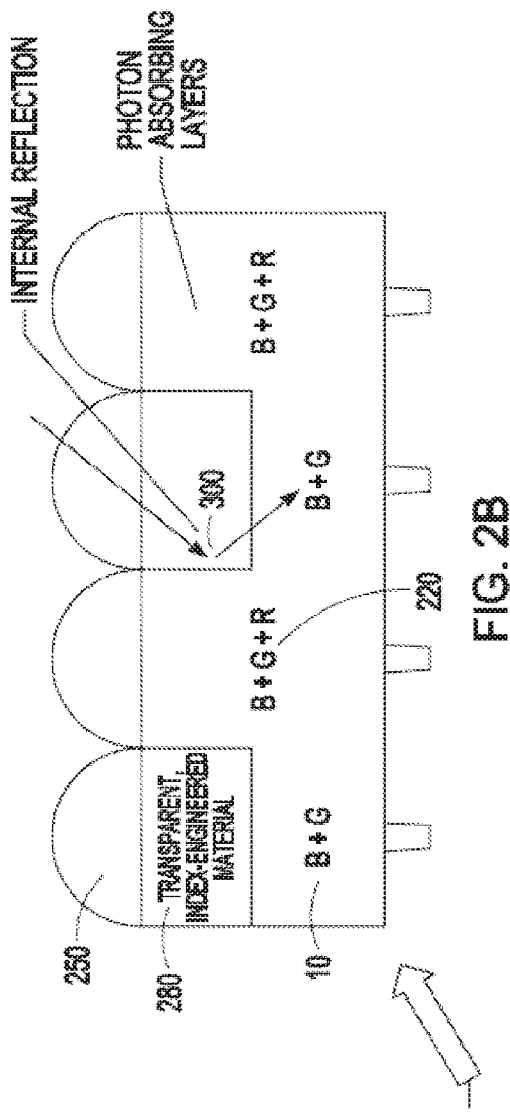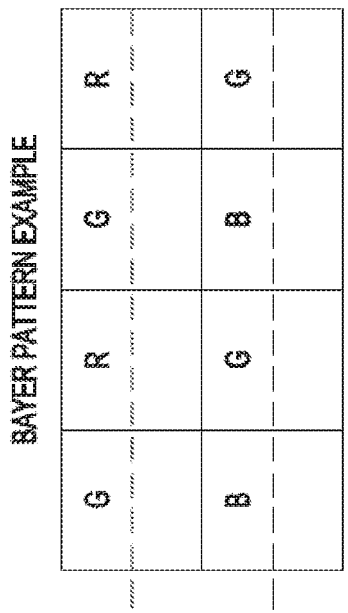

METHOD OF MANUFACTURING A COLOR IMAGE SENSOR HAVING AN OPTICALLY SENSITIVE MATERIAL WITH MULTIPLE THICKNESSES

PRIORITY CLAIM

The present application is a division of U.S. patent application Ser. No. 14/808,368, filed Jul. 24, 2015, which claims the benefit of priority of U.S. Provisional Patent Application Ser. No. 62/029,014, filed Jul. 25, 2014, and entitled "COLOR IMAGE SENSOR WITHOUT THE COLOR FILTERS," which is incorporated herein by reference in its entirety.

TECHNICAL FIELD

The present application relates generally to the field of optical and electronic systems and methods, and methods of making and using the devices and systems.

BACKGROUND

Embodiments of the disclosed subject matter relate to image sensors, and, more particularly, to image sensors that extract color or other wavelength-related information, including those that do so with the aid of multi-height light-sensing regions.

Conventional image sensors (CIS, CCD, etc.) typically use a color filter array (CFA) to extract color information to construct color images. A common method uses Red (R), Green (G), and Blue (B) color filters.

The color filter materials themselves absorb some photons, resulting in loss of quantum efficiency, and hence a lower signal-to-noise ratio (SNR).

Thick color filter material also results in worse Chief-Ray Angle (CRA), which is important in designing thinner camera modules and incorporating large aperture lenses.

Additionally, CFA process variations, such as thickness, size, and alignment, may cause excess crosstalk, where a portion of light intended to impinge only a first class of pixel regions associated with a first intended color in fact is incident on a second class associated with a second color. Such CFA process variations may also produce non-uniformity issues, further lowering the SNR, resulting in poor images.

Furthermore, a CFA is often responsible for reliability failures, and obvious process costs associated with the CFA process and yield loss are undesirable.

SUMMARY

Embodiments of the disclosed subject matter describe solutions that enable color sensing without the use of passive, separate color filters.

Materials have a defined penetration depth for a given wavelength of light. For example, for silicon, red light penetrates more deeply than does blue light. Consequently, one can make a thin piece of silicon that can absorb blue light very well, but cannot absorb red light very well.

For example, using this principle, one can design image sensor pixels that can be:

Type 1: Of a first, lower, thickness: Absorbs only blue light efficiently;

Type 2: Of a second, intermediate, thickness: Absorbs blue and green light efficiently, but red light only inefficiently; and Type 3: Absorbs blue, green, and red light efficiently.

By properly arranging the above types of pixels, including, but not limited to, a conventional Bayer Pattern, one can extract necessary color information for a given pixel using information from nearby pixels.

The application of this principle is not limited to red, green, and blue wavelengths, but other wavelengths can be used, including, for example, infrared.

In addition to primary colors such as red, green, and blue, etc. one can use any color combinations, including secondary colors such as cyan, yellow, magenta, etc.

This method and the disclosed structures can be used with any photon absorbing materials, including silicon, GaAs, organic, inorganic, and composite films. In embodiments, the light-absorbing material may include semiconductor nanoparticles in a matrix.

There are many possible methods to fabricate the aforementioned pixels, including but not limited to, conventional semiconductor processing such as spin-coating, deposition, epitaxial growth, and implants.

BRIEF DESCRIPTION OF THE DRAWINGS

FIG. 1A is an example of a Bayer-pattern layout;

FIG. 1B is a cross-sectional view through Green and Red equivalent of an embodiment of the disclosed subject matter;

FIG. 1C is a cross-sectional view through Blue and Green equivalent of an embodiment of the disclosed subject matter;

FIG. 2A is an example of a Bayer-pattern layout;

FIG. 2B is a cross-sectional view through Green and Red equivalent of an embodiment of the disclosed subject matter;

FIG. 2C is a cross-section view through Blue and Green equivalent of an embodiment of the disclosed subject matter;

FIG. 10 shows an embodiment of a single-plane computing device that may be used in computing, communication, gaming, interfacing, and so on;

FIG. 11 shows an embodiment of a double-plane computing device that may be used in computing, communication, gaming, interfacing, and so on;

Figure 3A:
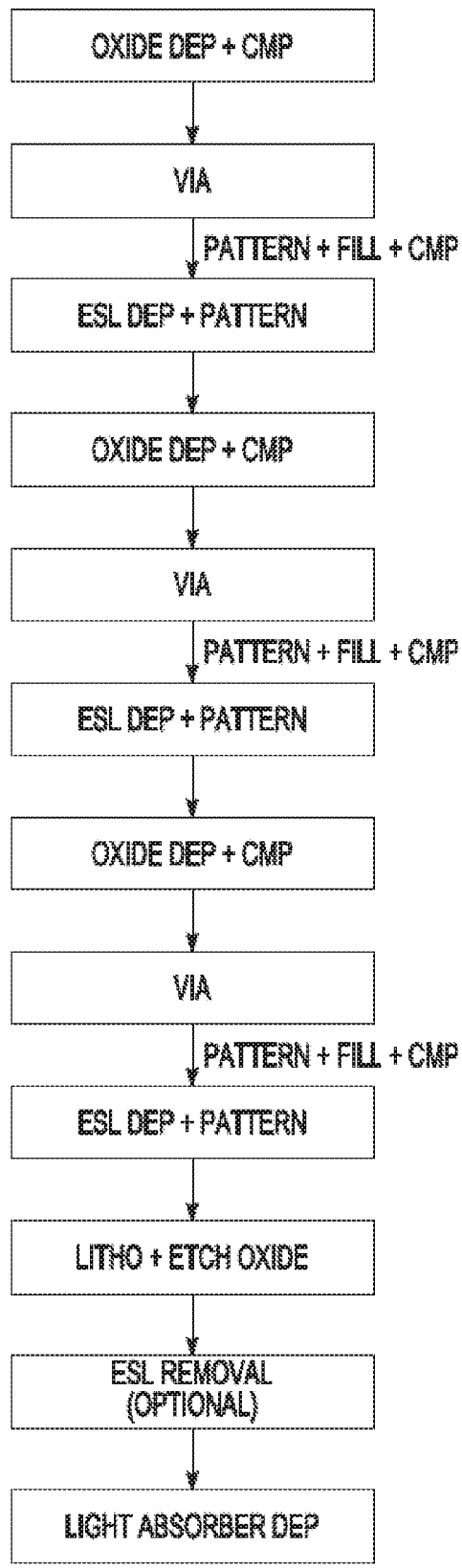
FIGS. 3A through 3G show example embodiments of methods and cross-sectional views of making the devices of, for example, FIGS. 1A through 1C.

Embodiments are described, by way of example only, with reference to the accompanying drawings. The drawings are not necessarily to scale. For clarity and conciseness, certain features of the embodiment may be exaggerated and shown in schematic form.

DETAILED DESCRIPTION

FIG. 1A shows an example of a Bayer-pattern layout. FIG. 1B and FIG. 1C are examples of embodiments of the disclosed subject matter, across the Bayer pattern row where the Green and Red equivalent pixels are located.

In this embodiment, Green equivalent pixel 10, Red equivalent pixel 20, and Blue equivalent pixel 30 are composed of photon absorbing layers. Photon absorbing layers can comprised be any photon absorbing material or materials. The photon absorbing material or materials can be deposited or grown by various methods.

Charge collecting structure 60 can include transfer transistor, metal electrodes, vias, etc.

A micro-lens (U-LENS or µ-lens) 50 is optional, as it may help improve CRA and X-talk.

There may be other features such as anti-reflective coating, which are not depicted in the illustration to avoid obscuring other aspects of the disclosed subject matter.

Using near-by pixels (for example, subtraction), one can extract color information of each pixel.

In more detail, with continuing reference to FIG. 1A through FIG. 1C, the thicknesses of the light absorbing layers 10, 20, 30 are selected according to colors for which they are targeted to absorb. For example, for light that is reaching the Blue equivalent pixel 30, blue photons are substantially absorbed and longer wavelengths of photons, such as Green and Red photons, mostly pass through the thin blue light absorbing layer 30. For light that reaches the Green equivalent pixel 10, blue and green photons are substantially absorbed, and the Red photons mostly pass through. Similarly, for light that reaches the Red equivalent pixel 20, all three Blue, Green, and Red photons are substantially absorbed.

In further detail, still referring to FIG. 1A through FIG. 1C, having three types of pixels each absorbing blue photons 30, blue+green 10, and blue+green+red 20, one can extract separate blue, green, and red signals using neighboring pixel information. The thickness of each light absorbing layer 10, 20, 30, is chosen dependent on which wavelengths of light the layer is targeted to absorb, taken together with the material properties such as extinction coefficients, carrier mobility, etc. In one embodiment, the thickness of the blue absorbing layer 30, may be in the thickness range of about 0.1 µm to about 0.3 µm, blue+green absorbing layer 10 may be in the range of about 0.2 µm to about 0.5 µm, and the red+blue+green absorbing layer 20 may be in the range of about 0.4 µm to about 1 µm in thickness. If different wavelengths are used to decipher color information, the thicknesses of the light absorbing layers may be changed.

Figure 3B:
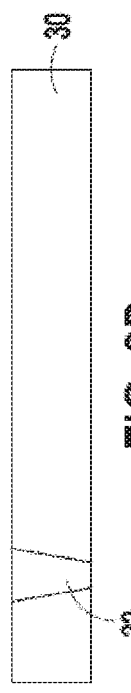
Figure 3C:
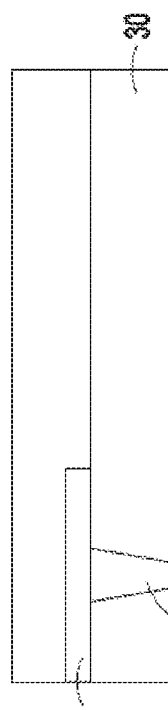
Figure 3D:
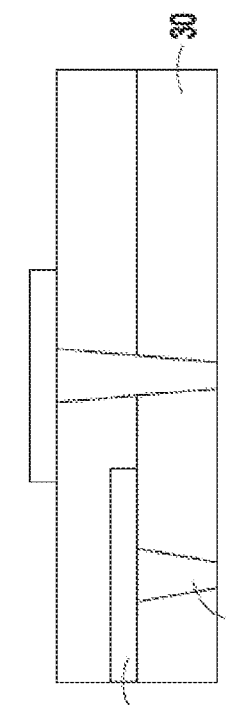
Figure 3E:
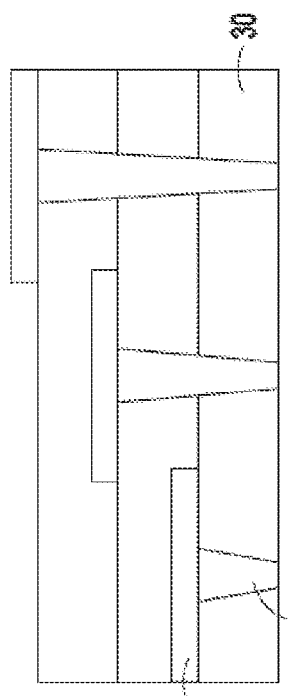
Figure 3F:
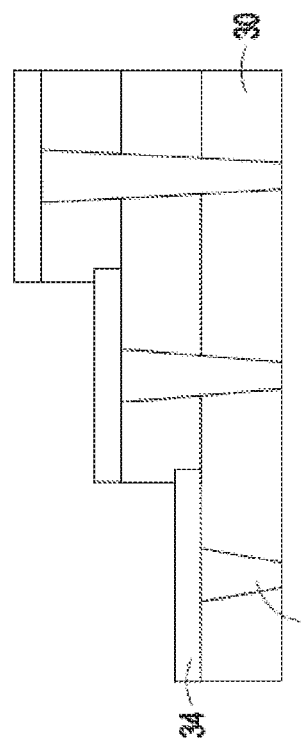
Figure 3G:
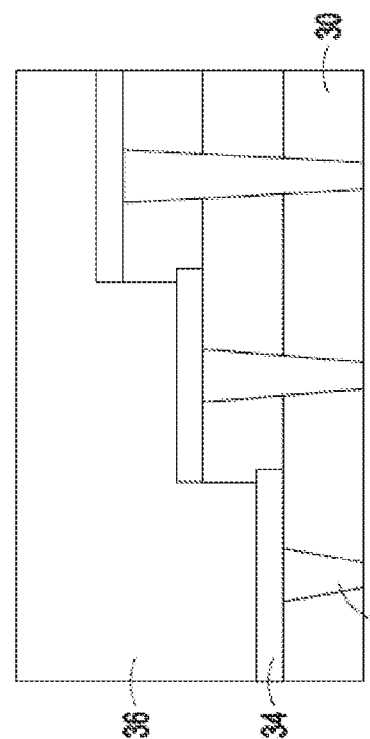

Example embodiments of methods of making the devices of FIG. 1A through 1C are depicted in FIG. 3A through FIG. 3G. In these embodiments, using three different color absorptions can use three different thicknesses of the light absorbing material 36 (FIG. 3G). FIG. 3B and FIG. 3C depict the formation of a first type of electrode using a conventional back-end of line (BEOL) process. On top of the via 32, an etch stop layer (ESL) 34 is deposited and patterned. The ESL 34 can be, but is not limited to, silicon nitride, silicon oxynitride, titanium, titanium nitride, aluminum, etc. This process is repeated to form all three types of electrodes as shown in the FIG. 3E. Then, using conventional lithography and etch processes, and using the etch stop layer 34, an oxide on top of the two types of electrodes are removed, resulting in FIG. 3F. On this ready substrate, the light absorbing layer 36 can be deposited, as shown in FIG. 3G.

Referring now to FIG. 2B and FIG. 2C are examples of another embodiment of the disclosed subject matter, across the Bayer pattern row where the Green and Red equivalent pixels are located.

In this embodiment, the Green equivalent pixel 10, a Red equivalent pixel 220, and a Blue equivalent pixel 230 are composed of photon absorbing layers. Photon absorbing layers can be comprised of any photon absorbing material or materials. The photon absorbing layer or layers can be deposited or grown by various methods.

The charge collecting structure 60 can include transfer transistor, metal electrodes, vias, etc.

A Micro-lens (U-LENS or µ-lens) 250 can help improve CRA and X-talk.

There may be other features such as anti-reflective coating, which are not depicted in the illustration to avoid obscuring other aspects of the disclosed subject matter.

Using near-by pixels (for example, subtraction), one can extract color information of each pixel.

Referring to FIG. 2A to FIG. 2C, the thicknesses of the light absorbing layers 10, 220, 230 are modulated, according to colors which they are targeted to absorb. For example, for light that is reaching the Blue equivalent pixel 230, blue photons are substantially absorbed and longer wavelengths of photons, such as Green and Red photons, mostly pass through the thin blue light absorbing layer 230. For light that reaches the Green equivalent pixel 10, blue and green photons are substantially absorbed, and the Red photons mostly pass through. Similarly, for light that reaches the Red equivalent pixel 220, all three Blue, Green, and Red photons are substantially absorbed.

With continuing reference to FIG. 2A through FIG. 2C, there is a transparent and index-engineered layer 280. This layer 280 is used to planarize the array. Additionally, this layer 280 does not absorb light and the index is engineered such that it induces internal reflection of light 300 to help photon collection.

With continuing reference to FIG. 2A to FIG. 2C, having three types of pixels each absorbing blue photons 230, blue+green 10, and blue+green+red 220, one can extract separate blue, green, and red signal using neighboring pixel information. The thicknesses of the each of the light absorbing layers 10, 220, 230, are dependent on which wavelengths of light they are targeted to absorb, as well as the material properties such as extinction coefficients, carrier mobility, etc.

In one embodiment, the thickness of the blue absorbing layer 230 may be in the thickness range of about 0.1 µm to about 0.3 µm, blue+green absorbing layer 10 may be in the range of about 0.2 µm to about 0.5 µm, and the red+blue+green absorbing layer 220 may be in the range of about 0.4 µm to about 1 µm in thickness. If different wavelengths are used to decipher color information, the thicknesses of the light absorbing layers may be changed.

Figure 4A:
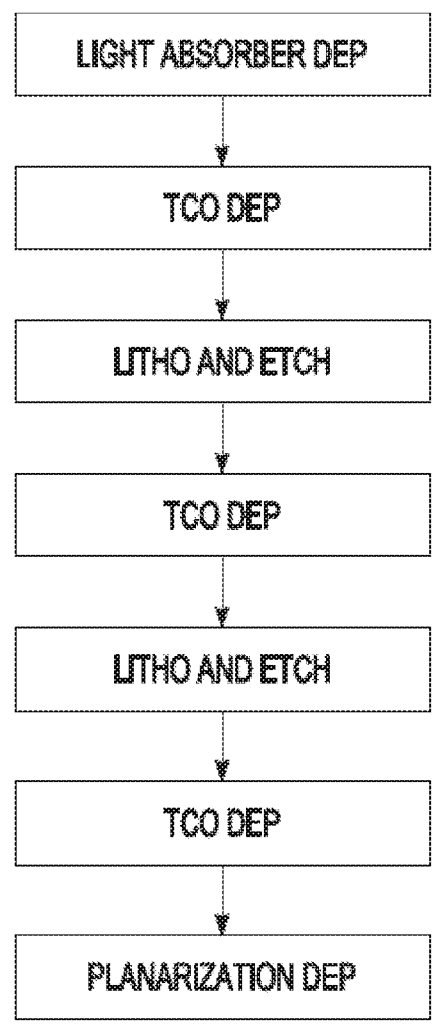
FIGS. 4A through 4G show example embodiments of methods and cross-sectional views of making the devices of, for example, FIGS. 2A through 2C.
Figure 4B:
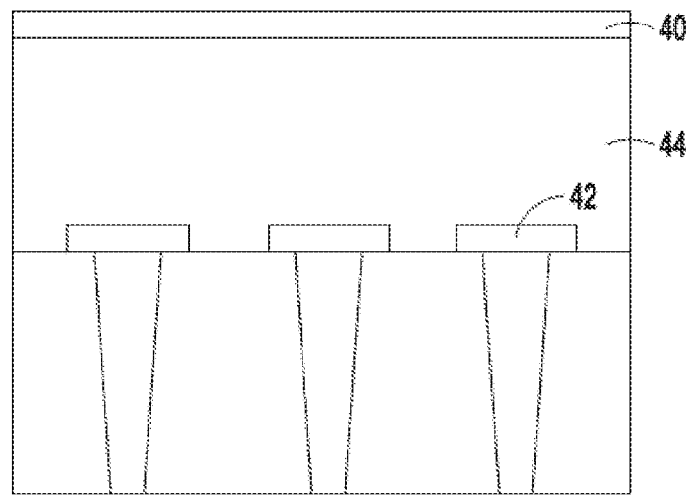
Figure 4C:
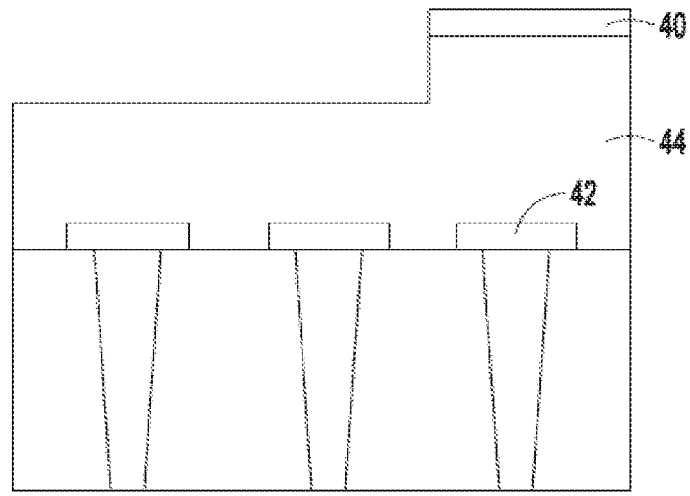
Figure 4D:
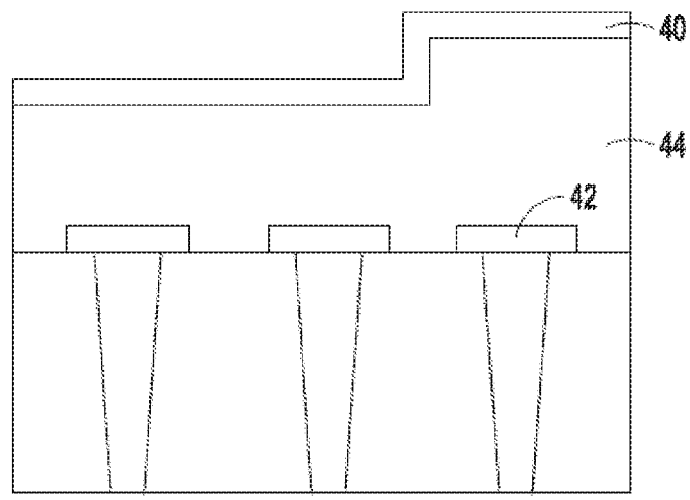
Figure 4E:
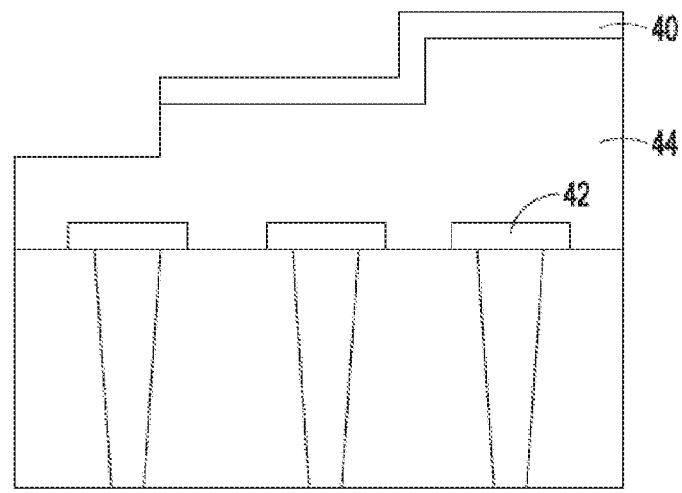
Figure 4F:
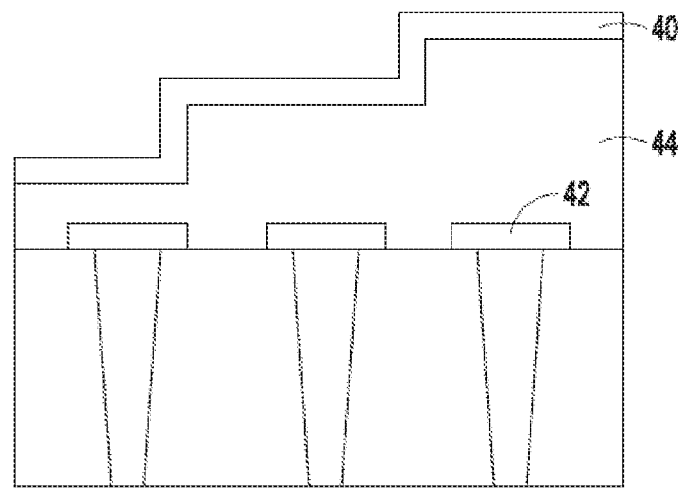
Figure 4G:
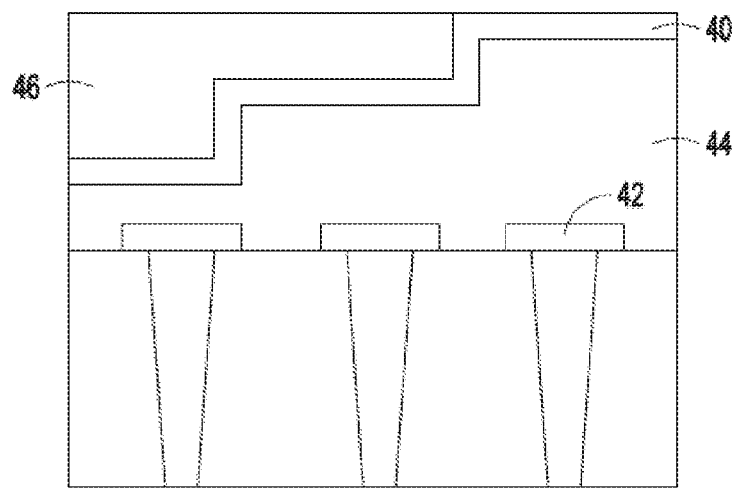

Example embodiments of methods of making the devices of FIG. 2A through 2C are depicted in FIG. 4A through FIG. 4G. In these embodiments, using three different color absorptions can use three different thicknesses of the light absorbing material 44. FIG. 4B depicts the formation of the bottom electrode 42, deposition of the light absorbing layer 44 and the top electrode 40, which can be, but is not limited to, transparent conductive oxide (TCO), nanoparticles, thick metals, organic and/or inorganic films, etc. Using lithography and etch, the light absorbing material 44 is partially removed, as shown in FIG. 4C. An additional top electrode 40 is deposited and the lithography and etch process is repeated to form three different thicknesses of the light absorbing layer 44, all covered with the top electrode 40, which is shown on the FIG. 4F. To planarize the array, the transparent planarizing layer 46 is applied, as shown in FIG. 4G.

The various illustrations of the methods and apparatuses provided herein are intended to provide a general understanding of the structure of various embodiments and are not intended to provide a complete description of all the elements and features of the apparatuses and methods that might make use of the structures, features, and materials described herein.

As discussed herein, in conventional images sensors, such as CMOS image sensors, typically used is a color filter array (CFA) to extract color information to construct color images. One common method uses Red, Green, and Blue (RGB) color filters; another uses Cyan, Green, Yellow, Magenta (CYGM); another uses Red, Green, Blue, and White (RGBW) implementation.

The disclosed subject matter, in embodiments, eliminates the need for a CFA. In alternative embodiments, the disclosed subject matter removes the need for at least one filter type (e.g., RGB solution can be implemented without at least one of an R, G, or B passive filter).

A current challenge with the use of CFA relates to successfully scaling conventional image sensors. Patterning small features such as regions of CFA to less than 1 µm is challenging. Doing so can negatively impact filter shape, spectral properties, crosstalk, and manufacturability.

Approaches embodied and discussed herein that eliminate or reduce CFA can enable scaling to smaller dimensions and with fewer compromises in performance.

Implementations of CFA that rely on a thick filter, typically in the range of about 0.4 µm to about 1.0 µm, typically suffer in their angular response as a result of the high vertical height combined with small lateral dimensions. Rays entering the color filter at a highly off-normal-incidence angle may be conveyed, not to the pixel that resides beneath the location of impingement, but instead beneath an adjacent pixel. This condition leads to crosstalk.

Embodiments of the disclosed subject matter eliminate at least one CFA layer, and improve crosstalk by ensuring that spectral filtering is implemented within the light-absorbing photodetector material itself.

Embodiments of the disclosed subject matter thereby enable a higher chief ray angle. This in turn enables design of an optical system that is lower in height (known as z-height) for a given sensor lateral dimension.

Another disadvantage of typical CFA-based color imaging can reside in an undesired absorption of light within the intended passband. In cases, loss can reach 30% in transmission even within the passband. Eliminating at least one CFA layer eliminates this source of loss. This can enhance signal-to-noise ratio at low light (dark-noise-limited regime), and also at medium and high light (photon-shot-noise-limited).

The CFA can be a source of failures in reliability of a typical image sensor. Reasons for the sources of failure include the fact that the CFA can be exposed to the environment, such as air, ultraviolet light, etc. In cases, protective layers are applied atop a CFA as a result. By removing at least one CFA layer or material as described herein, yield loss may be reduced. By removing at least one CFA layer, reliability may be improved. By removing at least one CFA layer, the extent of protective coatings required may be reduced or eliminated.

Embodiments of the disclosed subject matter include an RGB implementation. Embodiments also include infrared (IR) wavelength sensing solutions. In an example embodiment, an RGB-IR pixel matrix is implemented. One pixel class is made much deeper to also collect IR photons. IR sensing capability can thereby be incorporated into a visible sensor.

In embodiments, a pixel class may absorb all of Red, Green, and Blue (e.g., pixel 20 of FIG. 1B). This pixel may be termed a "white pixel." This pixel can achieve very high signal and consequently high signal-to-noise ratio for a given level of illumination.

As seen and described with reference to FIGS. 2B and 2C, above, lithography and etching may be used to modulate the thickness of the light-absorbing layers making up the optically sensitive material. Initially, the photon absorbing layers begin with having a substantially single, or common, thickness throughout. Photolithography is used to define the B+G pixels 220 and etched to a desired thickness. One example process is described herein with reference to FIG. 4A through FIG. 4G. An analogous procedure is repeated to define B pixels 230, and this example results in three types of pixels RGB. The sensor surface then can be planarized using a transparent material 280. Depending on the optical properties of the photon absorbing layers, it is possible to engineer the transparent material 280 to be engineered favorably to promote internal reflection 300 to improve photon collection. The planarization layer 230 may be deposited using various methods, including spin coating.

Referring again to FIG. 3A through FIG. 3G, the devices of FIG. 1A through FIG. 1C may be fabricated as depicted in FIG. 3A through FIG. 3G. In these embodiments, using three different color absorptions can use three different thicknesses of the light absorbing material 36. FIG. 3B and FIG. 3C show the formation of a first type of electrode using a conventional back-end of line (BEOL) process. On top of the via, an etch stop layer (ESL) 34 is deposited and patterned. The ESL 34 can be, but is not limited to, silicon nitride, silicon oxynitride, titanium, titanium nitride, aluminum, etc. The ESL layer may also be composed of multiple layers and not limited to a single material. The ESL will also double as the bottom electrode. Another inter-layer dielectric (ILD), such as oxide, is then deposited and planarized, as shown in the FIG. 3C. The thicknesses of the ILD layers are chosen based on the target thicknesses of the photon absorbing layers. Then the above-described process is repeated until a desired number of layers is reached, and in this example, three layers, RGB are shown in FIG. 3E. Then, using conventional anisotropic etch processes such as a reactive ion etch (RIE), and using the etch stop layer 34, an oxide on top of the two types of electrodes are removed, resulting in FIG. 3F. The ILD etch is self-stopping on the etch stop layers 34, as well as self-aligned with the etch stop layers 34. The deposit photon absorption layer 36 is then formed, as shown in FIG. 3G.

Algorithms and methods may be developed to subtract raw data from pixels of one class to infer color-specific information related to pixels of another class. In an example, raw data are obtained for pixel {B}, and separately in an adjacent thicker pixel for {B+G}. The computation {B+G} minus {B} allows estimation of {G}, that is, the green spectral component in this pixel region.

Embodiments include using a reduced, but not necessarily zero, number of CFA types or layers. For example, utilization of a single color filter on one type of pixel can reduce the number of photon absorbing layer thicknesses by one. For example, in the RGB case shown on the FIG. 3F, only two steps instead of three are used, if a color filter is used on one of them. This variation may be beneficial on certain applications as it may simplify image processing, with a possible trade off with the sensitivity.

In one embodiment, an image sensor includes a first pixel region comprising a pixel electrode, an optically sensitive material of a first thickness, and a counterelectrode; a second pixel region comprising a pixel electrode, an optically sensitive material of a second thickness, and a counterelectrode; the first pixel region is configured to detect light in a first spectral band; the second pixel region is configured to detect light in a second spectral band; and the first and second spectral bands include an overlapping spectral range, the second spectral band also includes a spectral range that is substantially undetectable by the first pixel region.

In various ones of the embodiments discussed herein, additional embodiments include the optically sensitive layer of the image sensor comprising at least one semiconductor nanoparticle. In embodiments, the first spectral band of the image sensor includes the range of about 450 nm to about 490 nm and the second spectral band includes the range of about 450 nm to about 570 nm. In embodiments, the first spectral band of the image sensor includes the range of about 450 nm to about 490 nm and the second spectral band includes the range of about 450 nm to about 570 nm. In embodiments, the first spectral band of the image sensor includes the range of about 450 nm to about 570 nm and the second spectral band includes the range of about 450 nm to about 630 nm. In embodiments, the first spectral band of the image sensor includes the range of about 450 nm to about 630 nm and the second spectral band includes the range of about 450 nm to about 960 nm. In embodiments, the first spectral band of the image sensor includes the range of about 450 nm to about 960 nm and the second spectral band includes the range of about 450 nm to about 1600 nm.

In one embodiment a method of making an image sensor includes producing an integrated circuit having trenches of a first depth defining a first class of pixel regions; and trenches of a second depth defining a second class of pixel regions; overcoating the trenched integrated circuit with a substantially planarizing optically sensitive material such that a difference in the thickness of the optically sensitive material in different regions overlying the integrated circuit is substantially defined by a difference in the first and the second trench depths.

In various ones of the embodiments discussed herein, additional embodiments include the optically sensitive layer employed by the method comprising at least one semiconductor nanoparticle.

Figure 5:
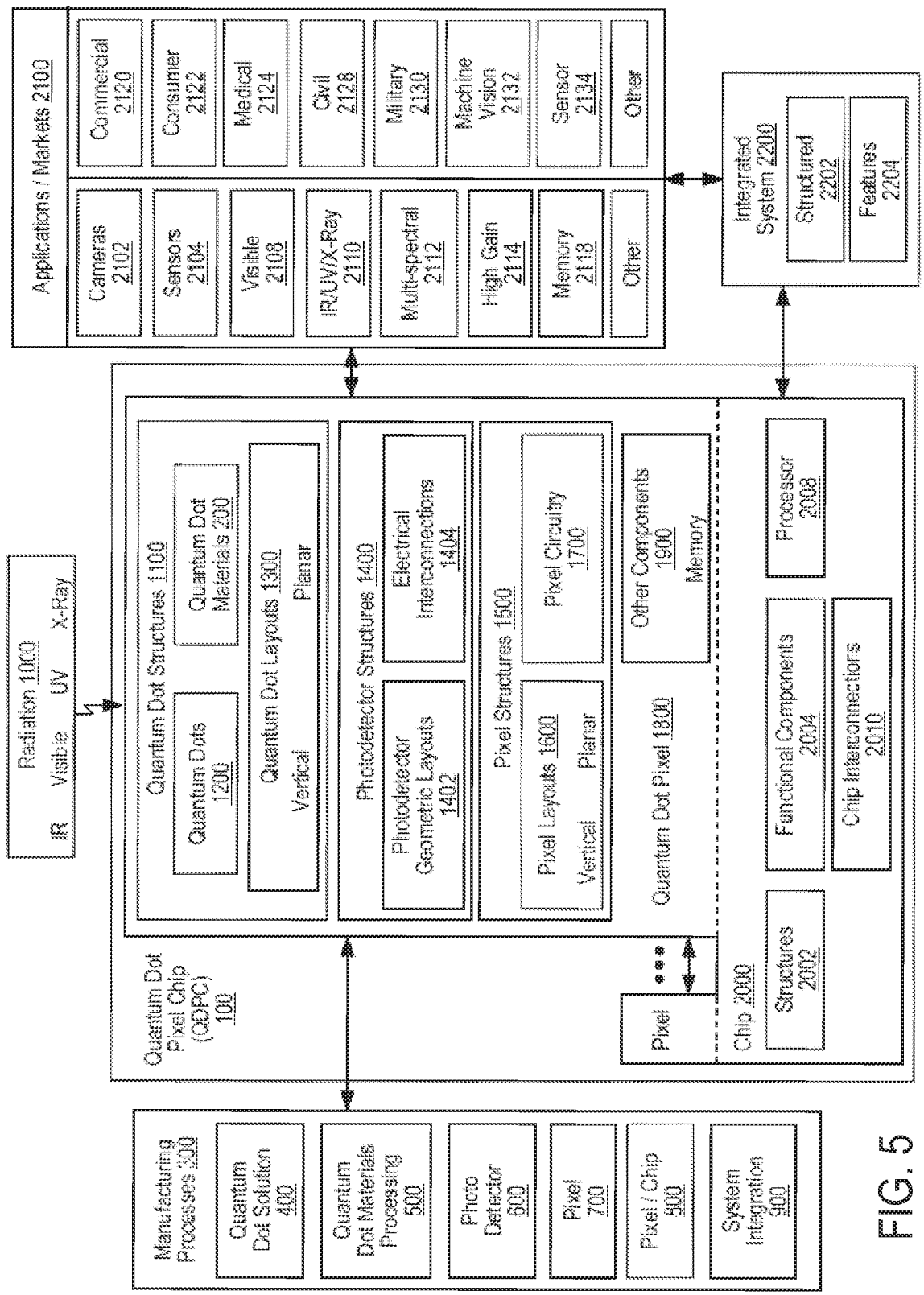
FIG. 5 shows overall structure and areas related to a quantum dot pixel chip, according to an embodiment.

Referring now to FIG. 5, example embodiments provide image sensing regions that use an array of pixel elements to detect an image. The pixel elements may include photosensitive material. The image sensor may detect a signal from the photosensitive material in each of the pixel regions that varies based on the intensity of light incident on the photosensitive material. In one example embodiment, the photosensitive material is a continuous film of interconnected nanoparticles. Electrodes are used to apply a bias across each pixel area. Pixel circuitry is used to integrate a signal in a charge store over a period of time for each pixel region. The circuit stores an electrical signal proportional to the intensity of light incident on the optically sensitive layer during the integration period. The electrical signal can then be read from the pixel circuitry and processed to construct a digital image corresponding to the light incident on the array of pixel elements. In example embodiments, the pixel circuitry may be formed on an integrated circuit device below the photosensitive material. For example, a nanocrystal photosensitive material may be layered over a CMOS integrated circuit device to form an image sensor. Metal contact layers from the CMOS integrated circuit may be electrically connected to the electrodes that provide a bias across the pixel regions. U.S. patent application Ser. No. 12/10,625, titled "Materials, Systems and Methods for Optoelectronic Devices," filed Apr. 18, 2008 (Publication No. 20090152664) includes additional descriptions of optoelectronic devices, systems and materials that may be used in connection with example embodiments and is hereby incorporated herein by reference in its entirety. This is an example embodiment only and other embodiments may use different photodetectors and photosensitive materials. For example, embodiments may use silicon or Gallium Arsenide (GaAs) photodetectors.

Image sensors incorporate arrays of photodetectors. These photodetectors sense light, converting it from an optical to an electronic signal. FIG. 5 shows structure of and areas relating to quantum dot pixel chip structures (QDPCs) 100, according to example embodiments. As illustrated in FIG. 5, the QDPC 100 may be adapted as a radiation 1000 receiver where quantum dot structures 1100 are presented to receive the radiation 1000, such as light. The QDPC 100 includes, as will be described in more detail herein, quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500. Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. In example embodiments, the pixel structures 1500 and pixel circuitry 1700 include structures and circuitry for film binning and/or circuit binning of separate color elements for multiple pixels as described herein. From an electrical viewpoint, the pixel circuitry 1700 may be in communication with other electronics (e.g., chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The other electronics may include circuitry or software to provide digital binning in example embodiments. The chip 2000 also includes physical structures 2002 and other functional components 2004, which will also be described in more detail below.

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation," "radiation," "electromagnetic spectrum," "spectrum," "radiation spectrum," and the like are used interchangeably, and the term color is used to depict a select band of radiation 1000 that could be within any portion of the radiation 1000 spectrum, and is not meant to be limited to any specific range of radiation 1000 such as in visible 'color'.

In the example embodiment of FIG. 5, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, color binning, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

A quantum dot 1200 may be a nanostructure, typically a semiconductor nanostructure that confines a conduction band electrons, valence band holes, or excitons (bound pairs of conduction band electrons and valence band holes) in all three spatial directions. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 6:
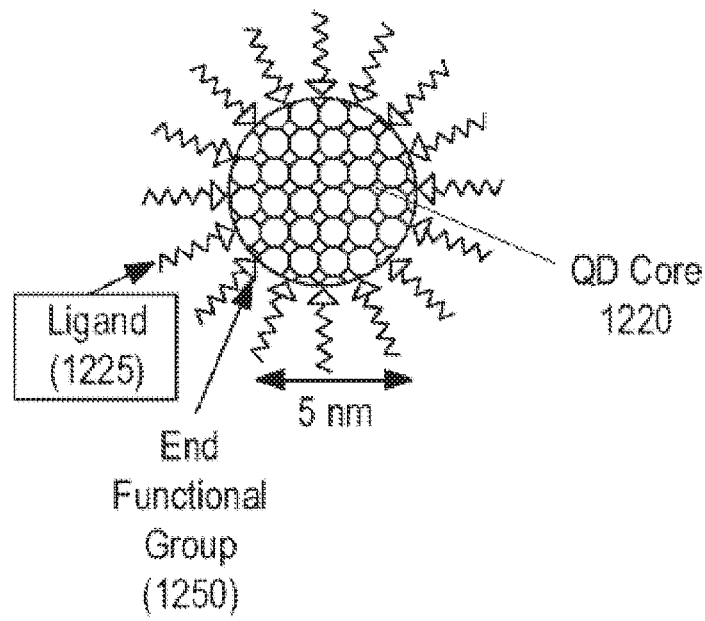
FIG. 6 shows an example of a quantum dot.

FIG. 6 shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In some embodiments, the cores 1220 of adjacent QDs may be fused together to form a continuous film of nanocrystal material with nanoscale features. In other embodiments, cores may be connected to one another by linker molecules.

Some embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The image sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, or as large as 30 microns by 30 microns or more or any range subsumed therein.

Figure 7:
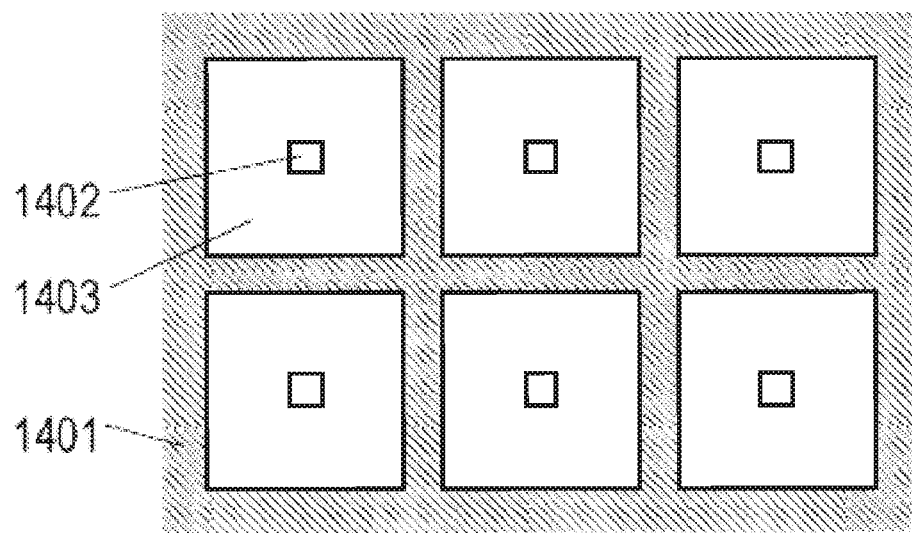
FIG. 7 shows a two-row by three-column sub-region within a generally larger array of top-surface electrodes.

The photodetector structure 1400 of FIGS. 5 and 7 show a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure.

In embodiments, processing may include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels doesn't decrease the required spatial resolution of the system. Binning may also be effective in increasing the speed with which the detector can be run, thus improving some feature of the system, such as focus or exposure. In example embodiments, binning may be used to combine subpixel elements for the same color or range of radiation (including UV and/or IR) to provide separate elements for a superpixel while preserving color/UV/IR resolution as further described below.

In embodiments the chip may have functional components that enable high-speed readout capabilities, which may facilitate the readout of large arrays, such as 5 Mpixels, 6 Mpixels, 8 Mpixels, 12 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. However, shrinking chip size may mean, for a given number of pixels, smaller pixels. In existing approaches, since radiation 1000 must propagate through the interconnect layer onto the monolithically integrated silicon photodiode lying beneath, there is a fill-factor compromise, whereby part of the underlying silicon area is obscured by interconnect; and, similarly, part of the silicon area is consumed by transistors used in read-out. One workaround is micro-lenses, which add cost and lead to a dependence in photodiode illumination on position within the chip (center vs. edges); another workaround is to go to smaller process geometries, which is costly and particularly challenging within the image sensor process with its custom implants.

In embodiments, the technology discussed herein may provide a way around these compromises. Pixel size, and thus chip size, may be scaled down without decreasing fill factor. Larger process geometries may be used because transistor size, and interconnect line-width, may not obscure pixels since the photodetectors are on the top surface, residing above the interconnect. In the technology proposed herein, large geometries such as 0.13 μm and 0.18 μm may be employed without obscuring pixels. Similarly, small geometries such as 90 nm and below may also be employed, and these may be standard, rather than image-sensor-customized, processes, leading to lower cost. The use of small geometries may be more compatible with high-speed digital signal processing on the same chip. This may lead to faster, cheaper, and/or higher-quality image sensor processing on chip. Also, the use of more advanced geometries for digital signal processing may contribute to lower power consumption for a given degree of image sensor processing functionality.

Figure 9:
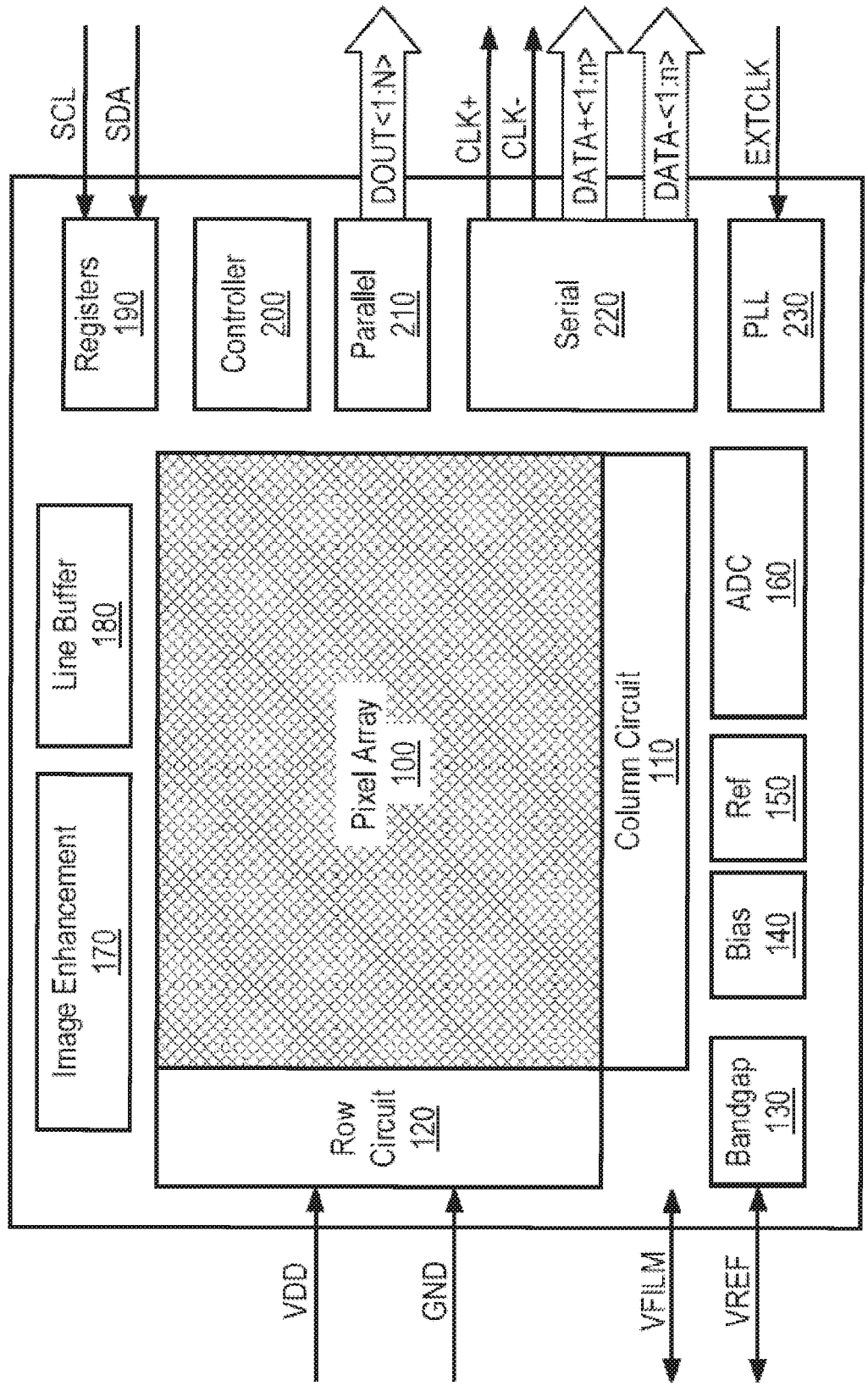
FIG. 9 is a block diagram of an example system configuration that may be used in combination with embodiments described herein.

An example integrated circuit system that can be used in combination with the above photodetectors, pixel regions and pixel circuits will now be described in connection with FIG. 9. FIG. 9 is a block diagram of an image sensor integrated circuit (also referred to as an image sensor chip). The chip is shown to include:

i. a pixel array (100) in which incident light is converted into electronic signals, and in which electronic signals are integrated into charge stores whose contents and voltage levels are related to the integrated light incident over the frame period; the pixel array may include color filters and electrode structures for color film binning as described further below;

ii. row and column circuits (110 and 120) which are used to reset each pixel, and read the signal related to the contents of each charge store, in order to convey the information related to the integrated light over each pixel over the frame period to the outer periphery of the chip; the pixel circuitry may include circuitry for color binning as described further below;

iii. analog circuits (130, 140, 150, 160, 230). The pixel electrical signal from the column circuits is fed into the analog-to-digital convert (160) where it is converted into a digital number representing the light level at each pixel. The pixel array and ADC are supported by analog circuits that provide bias and reference levels (130, 140, & 150).

iv. digital circuits (170, 180, 190, 200). The Image Enhancement circuitry (170) provides image enhancement functions to the data output from ADC to improve the signal to noise ratio. Line buffer (180) temporarily stores several lines of the pixel values to facilitate digital image processing and IO functionality. (190) is a bank of registers that prescribe the global operation of the system and/or the frame format. Block 200 controls the operation of the chip. The digital circuits may also include circuits or software for digital color binning;

v. IO circuits (210 & 220) support both parallel input/output and serial input/output. (210) is a parallel IO interface that outputs every bit of a pixel value simultaneously. (220) is a serial IO interface where every bit of a pixel value is output sequentially; and vi. a phase-locked loop (230) provides a clock to the whole chip.

In a particular example embodiment, when 0.11 μm CMOS technology node is employed, the periodic repeat distance of pixels along the row-axis and along the column-axis may be 900 nm, 1.1 μm, 1.2 μm, 1.4 μm, 1.75 μm, 2.2 μm, or larger. The implementation of the smallest of these pixels sizes, especially 900 nm, 1.1 μm, and 1.2 μm, may require transistor sharing among pairs or larger group of adjacent pixels in some embodiments.

Very small pixels can be implemented in part because all of the silicon circuit area associated with each pixel can be used for read-out electronics since the optical sensing function is achieved separately, in another vertical level, by the optically-sensitive layer that resides above the interconnect layer.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout.

Figure 8:
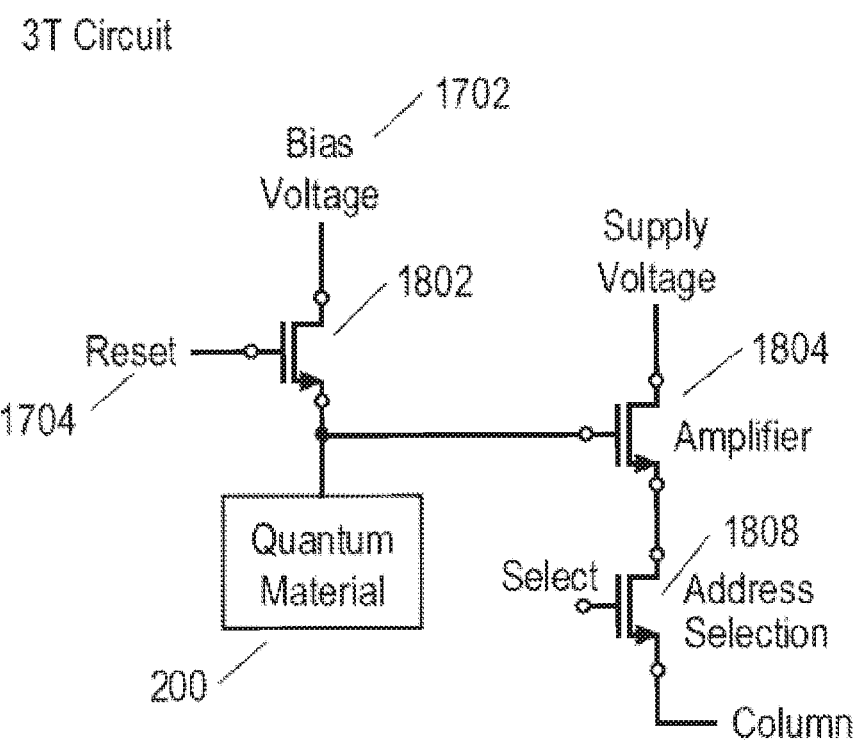
FIG. 8 illustrates a 3T transistor configuration for interfacing with the quantum dot material.

One embodiment of a pixel circuit shown in FIG. 8 uses a reset-bias transistor 1802, amplifier transistor 1804, and column address transistor 1808. This three-transistor circuit configuration may also be referred to as a 3T circuit. Here, the reset-bias transistor 1802 connects the bias voltage 1702 to the photoconductive photovoltaic quantum dot material 200 when reset 1704 is asserted, thus resetting the electrical state of the quantum dot material 200. After reset 1704, the quantum dot material 200 may be exposed to radiation 1000, resulting in a change in the electrical state of the quantum dot material 200, in this instance a change in voltage leading into the gate of the amplifier 1804. This voltage is then boosted by the amplifier transistor 1804 and presented to the address selection transistor 1808, which then appears at the column output of the address selection transistor 1808 when selected. In some embodiments, additional circuitry may be added to the pixel circuit to help subtract out dark signal contributions. In other embodiments, adjustments for dark signal can be made after the signal is read out of the pixel circuit. In example, embodiments, additional circuitry may be added for film binning or circuit binning.

Figure 10:
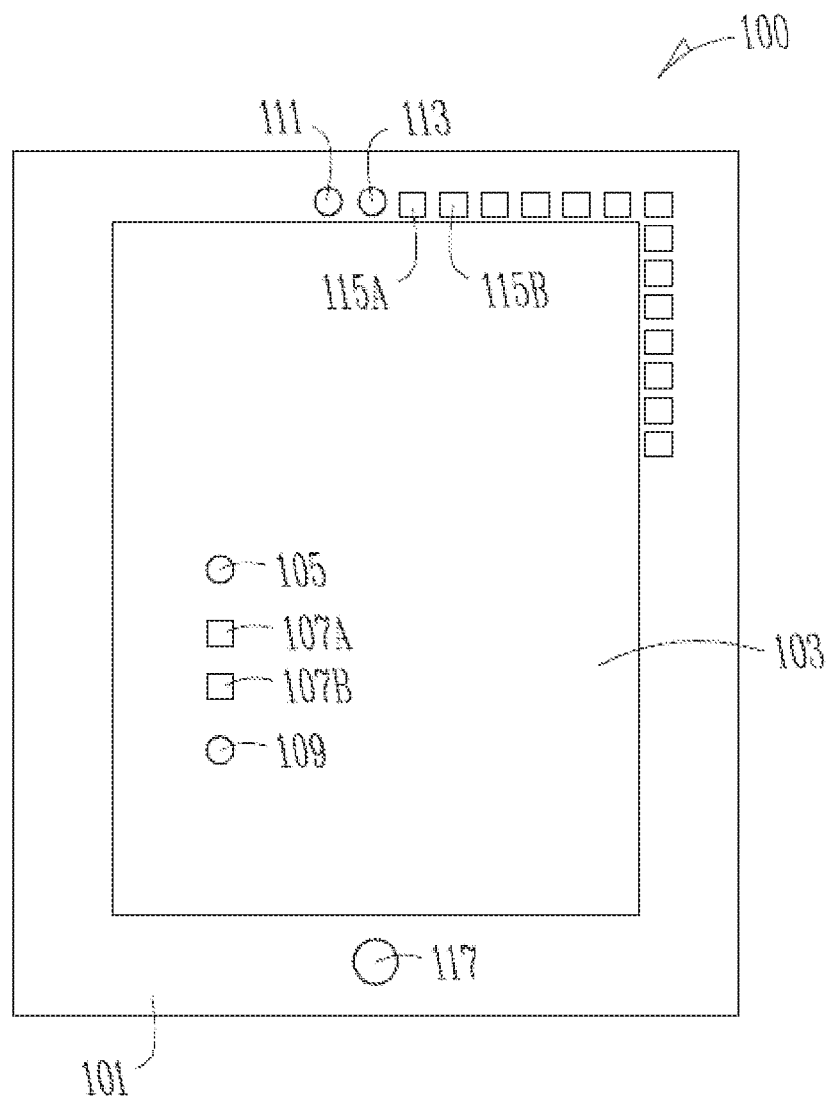

FIG. 10 shows an embodiment of a single-plane computing device 100 that may be used in computing, communication, gaming, interfacing, and so on. The single-plane computing device 100 is shown to include a peripheral region 101 and a display region 103. A touch-based interface device 117, such as a button or touchpad, may be used in interacting with the single-plane computing device 100.

An example of a first camera module 113 is shown to be situated within the peripheral region 101 of the single-plane computing device 100 and is described in further detail, below. Example light sensors 115A, 115B are also shown to be situated within the peripheral region 101 of the single-plane computing device 100 and are described in further detail, below, with reference to FIG. 13. An example of a second camera module 105 is shown to be situated in the display region 103 of the single-plane computing device 100 and is described in further detail, below, with reference to FIG. 12.

Examples of light sensors 107A, 107B, shown to be situated in the display region 103 of the single-plane computing device 100 and are described in further detail, below, with reference to FIG. 13. An example of a first source of optical illumination 111 (which may be structured or unstructured) is shown to be situated within the peripheral region 101 of the single-plane computing device 100. An example of a second source of optical illumination 109 is shown to be situated in the display region 103.

In embodiments, the display region 103 may be a touch-screen display. In embodiments, the single-plane computing device 100 may be a tablet computer. In embodiments, the single-plane computing device 100 may be a mobile handset.

Figure 11:
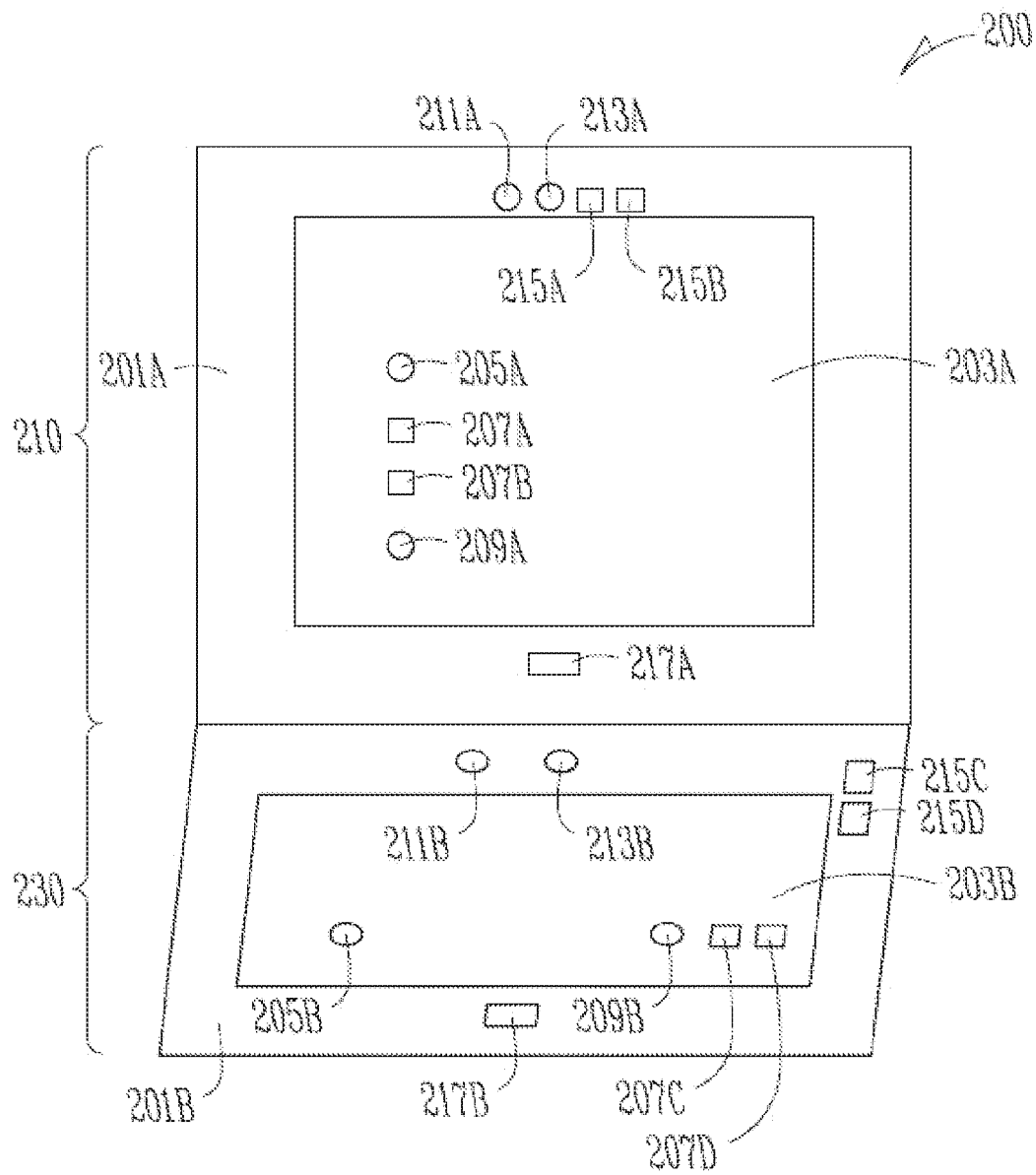

FIG. 11 shows an embodiment of a double-plane computing device 200 that may be used in computing, communication, gaming, interfacing, and so on. The double-plane computing device 200 is shown to include a first peripheral region 201A and a first display region 203A of a first plane 210, a second peripheral region 201B and a second display region 203B of a second plane 230, a first touch-based interface device 217A of the first plane 210 and a second touch-based interface device 217B of the second plane 230. The example touch-based interface devices 217A, 217B may be buttons or touchpads that may be used in interacting with the double-plane computing device 200. The second display region 203B may also be an input region in various embodiments.

The double-plane computing device 200 is also shown to include examples of a first camera module 213A in the first peripheral region 201A and a second camera module 213B in the second peripheral region 201B. The camera modules 213A, 213B are described in more detail, below, with reference to FIG. 12. As shown, the camera modules 213A, 213B are situated within the peripheral regions 201A, 201B of the double-plane computing device 200. Although a total of two camera modules are shown, a person of ordinary skill in the art will recognize that more or fewer light sensors may be employed.

A number of examples of light sensors 215A, 215B, 215C, 215D, are shown situated within the peripheral regions 201A, 201B of the double-plane computing device 200. Although a total of four light sensors are shown, a person of ordinary skill in the art will recognize that more or fewer light sensors may be employed. Examples of the light sensors 215A, 215B, 215C, 215D, are described, below, in further detail with reference to FIG. 12. As shown, the light sensors 215A, 215B, 215C, 215D, are situated within the peripheral regions 201A, 201B of the double-plane computing device 200.

The double-plane computing device 200 is also shown to include examples of a first camera module 205A in the first display region 203A and a second camera module 205B in the second display region 203B. The camera modules 205A, 205B are described in more detail, below, with reference to FIG. 12. As shown, the camera modules 205A, 205B are situated within the display regions 203A, 203B of the double-plane computing device 200. Also shown as being situated within the display regions 203A, 203B of the double-plane computing device 200 are examples of light sensors 207A, 207B, 207C, 207D. Although a total of four light sensors are shown, a person of ordinary skill in the art will recognize that more or fewer light sensors may be employed. Examples of the light sensors 207A, 207B, 207C, 207D are described, below, in further detail with reference to FIG. 13. Example sources of optical illumination 211A, 211B are shown situated within the peripheral region 201A, 201B and other example sources of optical illumination 209A, 209B are shown situated within one of the display regions 203A, 203B and are also described with reference to FIG. 13, below. A person of ordinary skill in the art will recognize that various numbers and locations of the described elements, other than those shown or described, may be implemented.

In embodiments, the double-plane computing device 200 may be a laptop computer. In embodiments, the double-plane computing device 200 may be a mobile handset.

Figure 12:
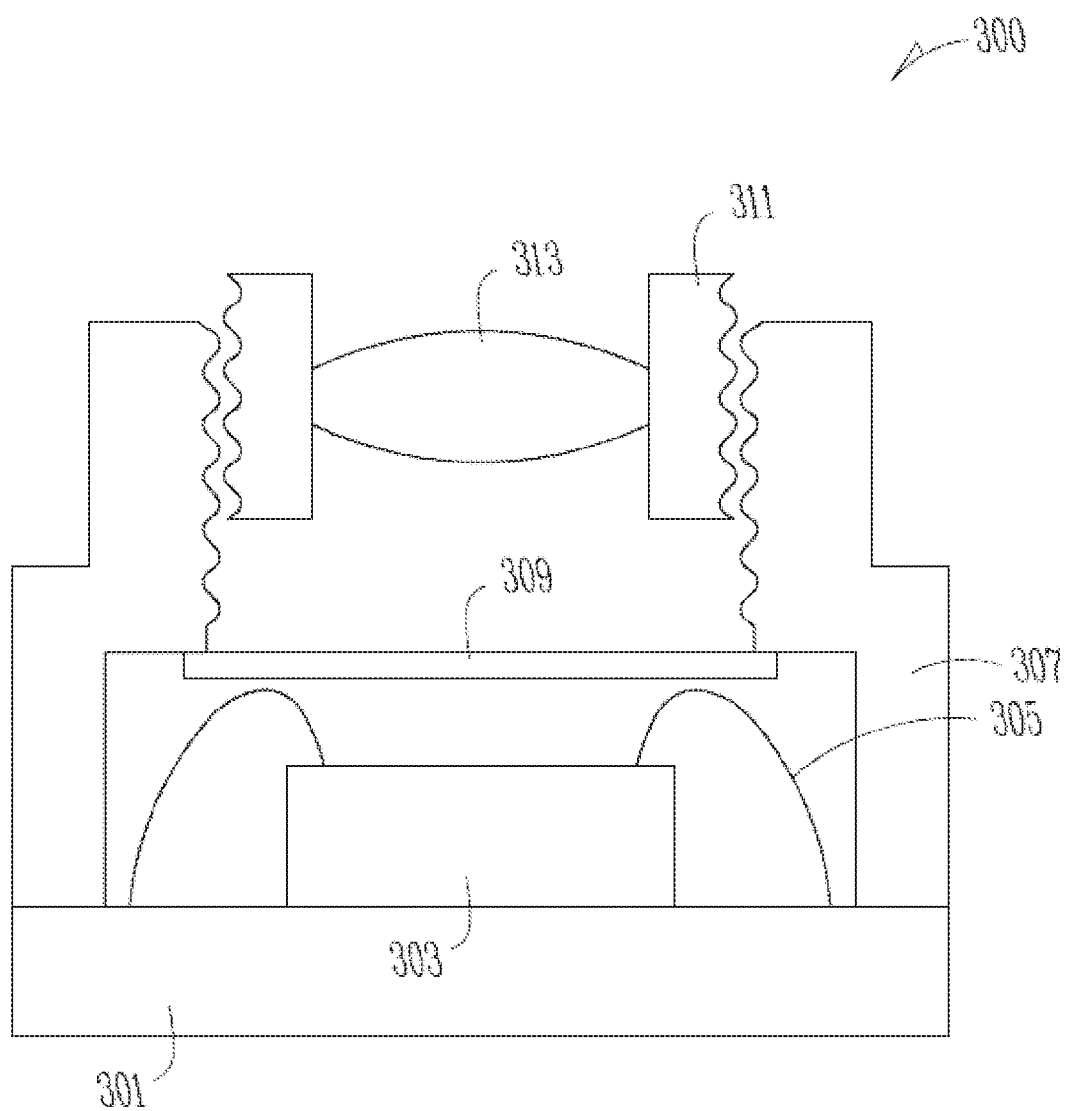
FIG. 12 shows an embodiment of a camera module that may be used with the computing devices of FIG. 10 or FIG. 11.

With reference now to FIG. 12, an embodiment of a camera module 300 that may be used with the computing devices of FIG. 10 or FIG. 11 is shown. The camera module 300 may correspond to the camera module 113 of FIG. 10 or the camera modules 213A, 213B of FIG. 11. As shown in FIG. 12, the camera module 300 includes a substrate 301, an image sensor 303, and bond wires 305. A holder 307 is positioned above the substrate. An optical filter 309 is shown mounted to a portion of the holder 307. A barrel 311 holds a lens 313 or a system of lenses.

Figure 13:
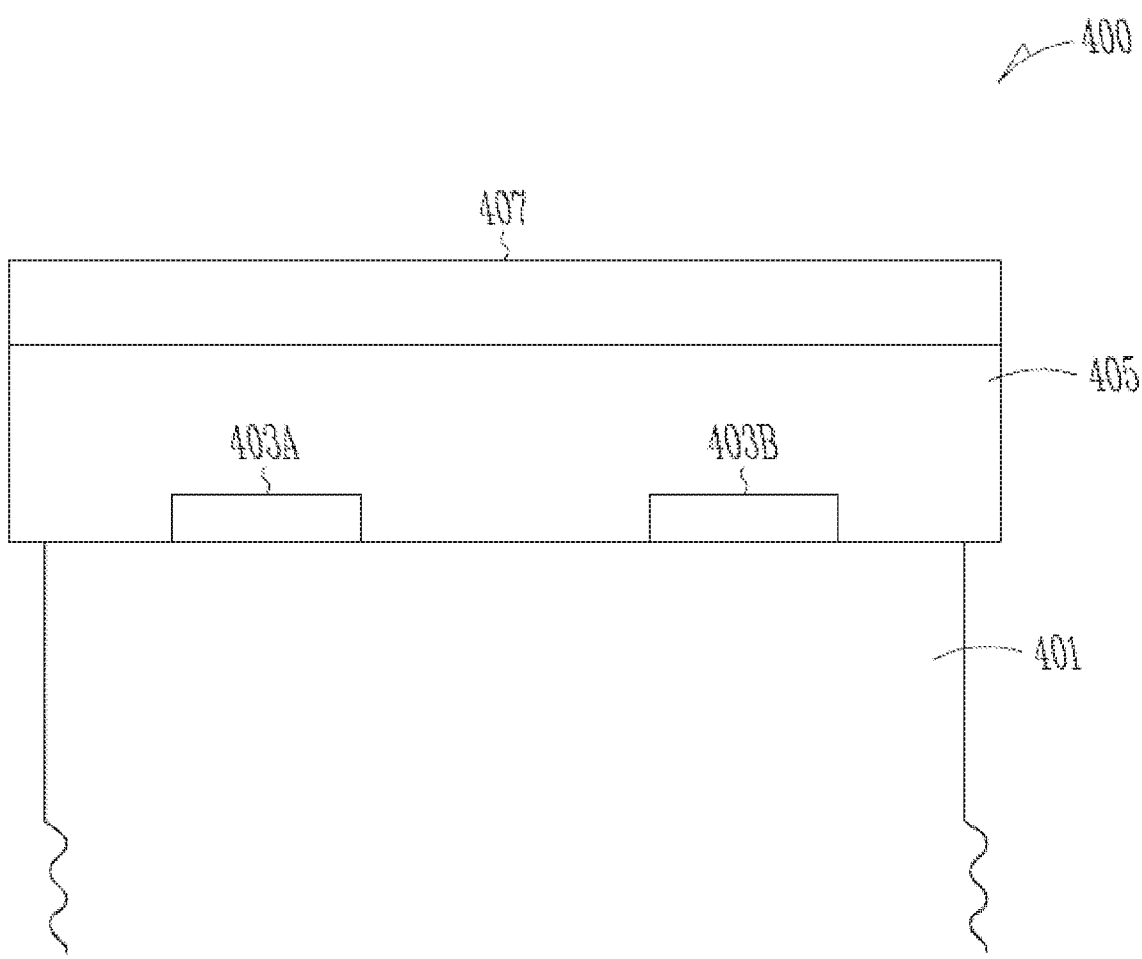
FIG. 13 shows an embodiment of a light sensor that may be used with the computing devices of FIG. 10 or FIG. 11.

FIG. 13 shows an embodiment of a light sensor 400 that may be used with the computing devices of FIG. 10 or FIG. 11 an example embodiment of a light sensor. The light sensor 400 may correspond to the light sensors 115A, 115B of FIG. 10 of the light sensors 215A, 215B, 215C, 215D of FIG. 11. The light sensor 400 is shown to include a substrate 401, which may correspond to a portion of either or both of the peripheral region 101 or the display region 103 of FIG. 10. The substrate 401 may also correspond to a portion of either or both of the peripheral regions 201A, 201B or the display regions 203A, 203B of FIG. 11. The light sensor 400 is also shown to include electrodes 403A, 403B used to provide a bias across light-absorbing material 405 and to collect photoelectrons therefrom. An encapsulation material 407 or a stack of encapsulation materials is shown over the light-absorbing material 405. Optionally, the encapsulation material 407 may include conductive encapsulation material for biasing and/or collecting photoelectrons from the light-absorbing material 405.

Elements of a either the single-plane computing device 100 of FIG. 10, or the double-plane computing device 200 of FIG. 11, may be connected or otherwise coupled with one another. Embodiments of the computing devices may include a processor. It may include functional blocks, and/or physically distinct components, that achieve computing, image processing, digital signal processing, storage of data, communication of data (through wired or wireless connections), the provision of power to devices, and control of devices. Devices that are in communication with the processor include devices of FIG. 10 may include the display region 103, the touch-based interface device 117, the camera modules 105, 113, the light sensors 115A, 115B, 107A, 107B, and the sources of optical illumination 109, 111. Similarly correspondences may apply to FIG. 11 as well.

The light sensor of FIG. 13 may include a light-absorbing material 405 of various designs and compositions. In embodiments, the light-absorbing material may be designed to have an absorbance that is sufficiently small, across the visible wavelength region approximately 450 nm to 650 nm, such that, in cases in which the light sensor of FIG. 13 is incorporated into the display region of a computing device, only a modest fraction of visible light incident upon the sensor is absorbed by the light-absorbing material. In this case, the quality of the images displayed using the display region is not substantially compromised by the incorporation of the light-absorbing material along the optical path of the display. In embodiments, the light-absorbing material 405 may absorb less than 30%, or less than 20%, or less than 10%, of light impinging upon it in across the visible spectral region.

In embodiments, the electrodes 403A, 403B, and, in the case of a conductive encapsulant for 407, the top electrode 407, may be constituted using materials that are substantially transparent across the visible wavelength region approximately 450 nm to 650 nm. In this case, the quality of the images displayed using the display region is not substantially compromised by the incorporation of the light-absorbing material along the optical path of the display.

In embodiments, the light sensor of FIG. 13 may include a light-sensing material capable of sensing infrared light. In embodiments, the light-sensing material may be a semiconductor having a bandgap corresponding to an infrared energy, such as in the range 0.5 eV-1.9 eV. In embodiments, the light-sensing material may have measurable absorption in the infrared spectral range; and may have measurable absorption also in the visible range. In embodiments, the light-sensing material may absorb a higher absorbance in the visible spectral range as in the infrared spectral range; yet may nevertheless be used to sense gesture-related signals in the infrared spectral range.

In an example embodiment, the absorbance of the light-sensing display-incorporated material may lie in the range 2-20% in the visible; and may lie in the range 0.1-5% in the infrared. In an example embodiment, the presence of visible light in the ambient, and/or emitted from the display, may produce a background signal within the light sensor, as a consequence of the material visible-wavelength absorption within the light-absorbing material of the light sensor. In an example embodiment, sensing in the infrared region may also be achieved. The light sources used in aid of gesture recognition may be modulated using spatial, or temporal, codes, allowing them to be distinguished from the visible-wavelength-related component of the signal observed in the light sensor. In an example embodiment, at least one light source used in aid of gesture recognition may be modulated in time using a code having a frequency component greater than 100 Hz, 1000 Hz, 10 kHz, or 100 kHz. In an example embodiment, the light sensor may have a temporal response having a cutoff frequency greater than said frequency components. In embodiments, circuitry may be employed to ensure that the frequency component corresponding to gesture recognition can be extracted and monitored, with the background components related to the room ambient, the display illumination, and other such non-gesture-related background information substantially removed. In this example, the light sensors, even though they absorb both visible and infrared light, can provide a signal that is primarily related to gestural information of interest in gesture recognition.

In an example embodiment, an optical source having a total optical power of approximately 1 mW may be employed. When illuminating an object a distance approximately 10 cm away, where the object has area approximately 1 cm$^2$ and diffuse reflectance approximately 20%, then the amount of power incident on a light sensor having area 1 cm2 may be of order 100 pW. In an example embodiment, a light sensor having absorbance of 1% may be employed, corresponding to a photocurrent related to the light received as a consequence of the illumination via the optical source, and reflected or scattered off of the object, and thus incident onto the light sensor, may therefore be of order pW. In example embodiments, the electrical signal reported by the light sensor may correspond to approximately pA signal component at the modulation frequency of the optical source. In example embodiments, a large additional signal component, such as in the nA or μA range, may arise due to visible and infrared background, display light, etc. In example embodiments, the relatively small signal components, with its distinctive temporal and/or spatial signature as provided by modulation (in time and/or space) of the illumination source, may nevertheless be isolated relative to other background/signal, and may be employed to discern gestural information.

In embodiments, light-absorbing material 405 may consist of a material that principally absorbs infrared light in a certain band; and that is substantially transparent to visible-wavelength light. In an example embodiment, a material such as PBDTT-DPP, the near-infrared light-sensitive polymer poly(2,60-4,8-bis(5-ethylhexylthienyl)benzo-[1,2-b;3,4-b]dithiophene-alt-5-dibutyloctyl-3,6-bis(5-bromothiophen-2-yl)pyrrolo[3,4-c]pyrrole-1,4-dione), may be employed as a component of the light-absorbing layer.

In embodiments, the electronic signal produced by the light sensor may be communicated to a device for electronic amplification. This device may amplify a specific electronic frequency band more than other bands, producing an enhanced signal component that is related to the gestural information. The signal from the light sensor, possibly with the combination of amplification (potentially frequency-dependent), may be input to an analog-to-digital converter that can produce a digital signal related to the gestural information. The digital information related to gestural information can be further conveyed to other integrated circuits and/or signal processing engines in the context of a system. For example, it may be conveyed to an application processor.

In embodiments, optical sources used to illuminate a volume of space, with the goal of enabling gesture recognition, may use illumination at a near infrared wavelength that is substantially unseen by the human eye. In an example embodiment, a light-emitting diode having center wavelength of approximately 950 nm may be employed.

In embodiments, gesture recognition may be accomplished by combining information from at least one camera, embedded into the computing device, and having a lens providing a substantially focused image onto an image sensor that is part of the camera; and may also incorporate sensors in the peripheral region, and/or integrated into the display region. In embodiments, the distributed sensors may provide general information on the spatio-temporal movements of the object being imaged; and the signals from the at least one camera(s) may be combined with the distributed sensors' signals to provide a more spatially-/temporally-accurate picture of the two- or three-dimensional motion of the object whose gesture is to be recognized. In an example embodiment, the camera may employ an image sensor providing a modest spatial resolution, such as QVGA, VGA, SVGA, etc., and thus be implemented using an image sensor having small die size and thus low cost; and also be implemented using a camera module having small x, y, and z form factor, enabling minimal consumption of peripheral region area, and no substantial addition to the z-height of the tablet or other computing device. In embodiments, a moderate frame rate, such as 15 fps, 30 fps, or 60 fps may be employed, which, combined with a modest resolution, enables a low-cost digital communication channel and moderate complexity of signal processing in the recognition of gestures. In embodiments, the at least one camera module may implement wide field of view imaging in order to provide a wide angular range in the assessment of gestures in relation to a display.

In embodiments, at least one camera module may be tilted, having its angle of regard nonparallel to the normal direction (perpendicular direction) to the display, enabling the at least one camera to image an angular extent in closer proximity to the display. In embodiments, multiple cameras may be employed in combination, each having an angle of regard distinct from at least one another, thereby enabling gestures in moderate proximity to the display to be imaged and interpreted. In embodiments, the at least one camera may employ an image sensor sensitized using light-detecting materials that provide high quantum efficiency, for example, greater than 30%, at near infrared wavelength used by the illuminating source; this enables reduced requirement for power and/or intensity in the illuminating source.

In embodiments, the illuminating source may be modulated in time at a specific frequency and employing a specific temporal pattern (e.g., a series of pulses of known spacing and width in time); and the signal from the at least one camera and/or the at least one distributed sensor may be interpreted with knowledge of the phase and temporal profile of the illuminating source; and in this manner, increased signal-to-noise ratio, akin to lock-in or boxcar-averaging or other filtering and/or analog or digital signal processing methods, may be used to substantially pinpoint the modulated, hence illuminated signal, and substantially remove or minimize the background signal associated with the background scene.

Figure 14:
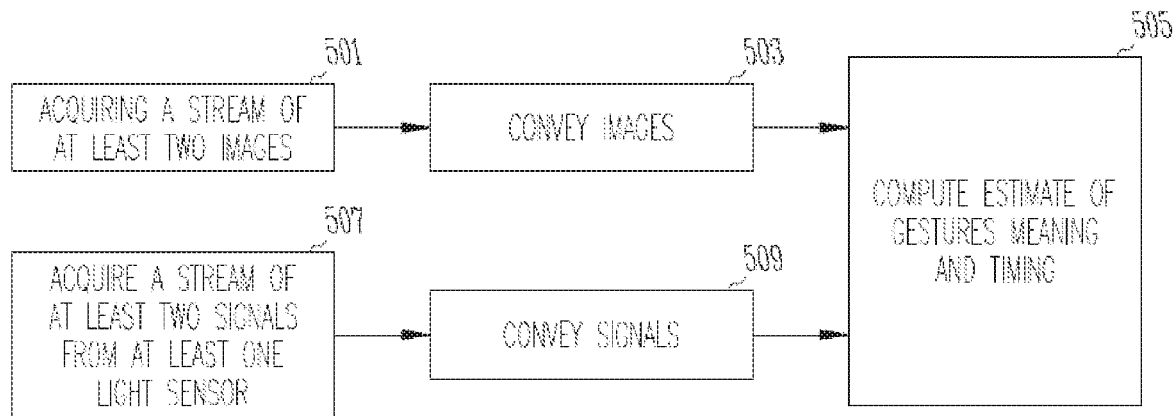
FIG. 14 and FIG. 15 show embodiments of methods of gesture recognition.

FIG. 14 shows an embodiment of a method of gesture recognition. The method comprises an operation 501 that includes acquiring a stream in time of at least two images from each of at least one of the camera module(s); and an operation 507 that includes also acquiring a stream, in time, of at least two signals from each of at least one of the light sensors. The method further comprises, at operations 503 and 509, conveying the images and/or signals to a processor. The method further comprises, at operation 505, using the processor, an estimate of a gesture's meaning, and timing, based on the combination of the images and signals.

Figure 15:
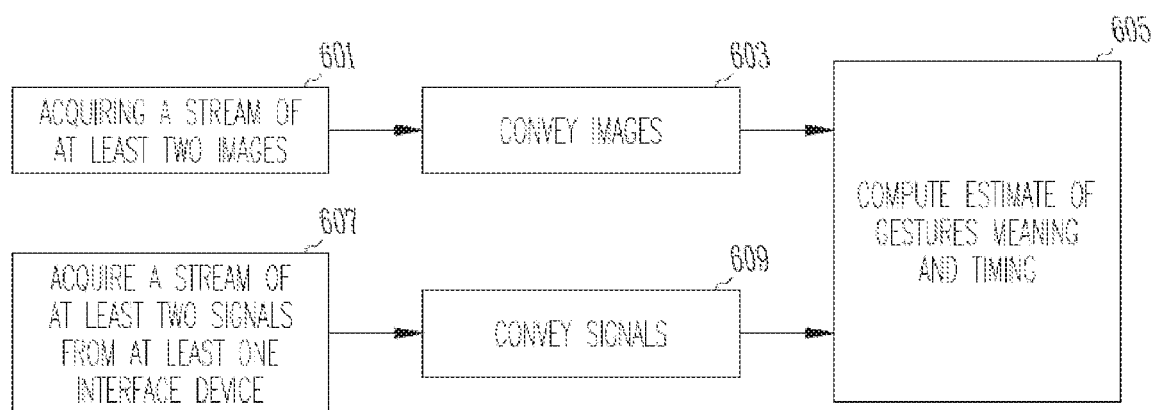

FIG. 15 shows an embodiment of a method of gesture recognition. The method comprises an operation 601 that includes acquiring a stream in time of at least two images from each of at least one of the camera modules; and an operation 607 that includes also acquiring a stream, in time, of at least two signals from each of at least one of the touch-based interface devices. The method further comprises, at operations 603 and 609, conveying the images and/or signals to a processor. The method further comprises, at operation 605, using the processor, an estimate of a gesture's meaning, and timing, based on the combination of the images and signals.

In embodiments, signals received by at least one of (1) the touch-based interface devices; (2) the camera modules; (3) the light sensors, each of these either within the peripheral and/or the display or display/input regions, may be employed and, singly or jointly, used to determine the presence, and the type, of gesture indicated by a user of the device.

Referring again to FIG. 14, in embodiments, a stream, in time, of images is acquired from each of at least one of the camera modules. A stream, in time, of at least two signals from each of at least one of the light sensors is also acquired. In embodiments, the streams may be acquired from the different classes of peripheral devices synchronously. In embodiments, the streams may be acquired with known time stamps indicating when each was acquired relative to the others, for example, to some conference reference time point. In embodiments, the streams are conveyed to a processor. The processor computes an estimate of the gesture's meaning, and timing, based on the combination of the images and signals.

In embodiments, at least one camera module has a wide field of view exceeding about 40°. In embodiments, at least one camera module employs a fisheye lens. In embodiments, at least one image sensor achieves higher resolution at its center, and lower resolution in its periphery. In embodiments, at least one image sensor uses smaller pixels near its center and larger pixels near its periphery.

In embodiments, active illumination via at least one light source; combined with partial reflection and/or partial scattering off of a proximate object; combined with light sensing using at least one optical module or light sensor; may be combined to detect proximity to an object. In embodiments, information regarding such proximity may be used to reduce power consumption of the device. In embodiments, power consumption may be reduced by dimming, or turning off, power-consuming components such as a display.

In embodiments, at least one optical source may emit infrared light. In embodiments, at least one optical source may emit infrared light in the near infrared between about 700 nm and about 1100 nm. In embodiments, at least one optical source may emit infrared light in the short-wavelength infrared between about 1100 nm and about 1700 nm wavelength. In embodiments, the light emitted by the optical source is substantially not visible to the user of the device.

In embodiments, at least one optical source may project a structured light image. In embodiments, spatial patterned illumination, combined with imaging, may be employed to estimate the relative distance of objects relative to the imaging system.

In embodiments, at least two lensing systems may be employed to image a scene, or portions of a scene, onto two distinct regions of a monolithically-integrated single image sensor integrated circuit; and the patterns of light thus acquired using the image sensor integrated circuit may be used to aid in estimating the relative or absolute distances of objects relative to the image sensor system.

In embodiments, at least two lensing systems may be employed to image a scene, or portions of a scene, onto two distinct image sensor integrated circuits housed within a single camera system; and the patterns of light thus acquired using the image sensor integrated circuits may be used to aid in estimating the relative or absolute distances of objects relative to the image sensor system.

In embodiments, at least two lensing systems may be employed to image a scene, or portions of a scene, onto two distinct image sensor integrated circuits housed within separate camera systems or subsystems; and the patterns of light thus acquired using the image sensor integrated circuits may be used to aid in estimating the relative or absolute distances of objects relative to the image sensor systems or subsystems.

In embodiments, the different angles of regard, or perspectives, from which the at least two optical systems perceive the scene, may be used to aid in estimating the relative or absolute distances of objects relative to the image sensor system.

In embodiments, light sensors such as the light sensors 115A, 115B situated in the peripheral region 101 of FIG. 10, and/or the light sensors 107A, 107B situated in the display region 103 of FIG. 10, may be used singly, or in combination with one another, and/or in combination with camera modules, to acquire information about a scene. In embodiments, light sensors may employ lenses to aid in directing light from certain regions of a scene onto specific light sensors. In embodiments, light sensors may employ systems for aperturing, such as light-blocking housings, that define a limited angular range over which light from a scene will impinge on a certain light sensor. In embodiments, a specific light sensor will, with the aid of aperturing, be responsible for sensing light from within a specific angular cone of incidence.

In embodiments, the different angles of regard, or perspectives, from which the at least two optical systems perceive the scene, may be used to aid in estimating the relative or absolute distances of objects relative to the image sensor system.

In embodiments, the time sequence of light detector from at least two light sensors may be used to estimate the direction and velocity of an object. In embodiments, the time sequence of light detector from at least two light sensors may be used to ascertain that a gesture was made by a user of a computing device. In embodiments, the time sequence of light detector from at least two light sensors may be used to classify the gesture that was made by a user of a computing device. In embodiments, information regarding the classification of a gesture, as well as the estimated occurrence in time of the classified gesture, may be conveyed to other systems or subsystems within a computing device, including to a processing unit.

In embodiments, light sensors may be integrated into the display region of a computing device, for example, the light sensors 107A, 107B of FIG. 10. In embodiments, the incorporation of the light sensors into the display region can be achieved without the operation of the display in the conveyance of visual information to the user being substantially altered. In embodiments, the display may convey visual information to the user principally using visible wavelengths in the range of about 400 nm to about 650 nm, while the light sensors may acquire visual information regarding the scene principally using infrared light of wavelengths longer than about 650 nm. In embodiments, a 'display plane' operating principally in the visible wavelength region may reside in front of—closer to the user— than a 'light sensing plane' that may operate principally in the infrared spectral region.

In embodiments, structured light of a first type may be employed, and of a second type may also be employed, and the information from the at least two structured light illuminations may be usefully combined to ascertain information regarding a scene that exceeds the information contained in either isolated structured light image.

In embodiments, structured light of a first type may be employed to illuminate a scene and may be presented from a first source providing a first angle of illumination; and structured light of a second type may be employed to illuminate a scene and may be presented from a second source providing a second angle of illumination.

In embodiments, structured light of a first type and a first angle of illumination may be sensed using a first image sensor providing a first angle of sensing; and also using a second image sensor providing a second angle of sensing.

In embodiments, structured light having a first pattern may be presented from a first source; and structured light having a second pattern may be presented from a second source.

In embodiments, structured light having a first pattern may be presented from a source during a first time period; and structured light having a second pattern may be presented from a source during a second time period.

In embodiments, structured light of a first wavelength may be used to illuminate a scene from a first source having a first angle of illumination; and structured light of a second wavelength may be used to illuminate a scene from a second source having a second angle of illumination.

In embodiments, structured light of a first wavelength may be used to illuminate a scene using a first pattern; and structured light of a second wavelength may be used to illuminate a scene using a second pattern. In embodiments, a first image sensor may sense the scene with a strong response at the first wavelength and a weak response at the second wavelength; and a second image sensor may sense the scene with a strong response at the second wavelength and a weak response at the first wavelength. In embodiments, an image sensor may consist of a first class of pixels having strong response at the first wavelength and weak response at the second wavelength; and of a second class of pixels having strong response at the second wavelength and weak response at the first wavelength.

Embodiments include image sensor systems that employ a filter having a first bandpass spectral region; a first bandblock spectral region; and a second bandpass spectral region. Embodiments include the first bandpass region corresponding to the visible spectral region; the first bandblock spectral region corresponding to a first portion of the infrared; and the second bandpass spectral region corresponding to a second portion of the infrared. Embodiments include using a first time period to detect primarily the visible-wavelength scene; and using active illumination within the second bandpass region during a second time period to detect the sum of a visible-wavelength scene and an actively-illuminated infrared scene; and using the difference between images acquired during the two time periods to infer a primarily actively-illuminated infrared scene. Embodiments include using structured light during the second time period. Embodiments include using infrared structured light. Embodiments include using the structured light images to infer depth information regarding the scene; and in tagging, or manipulating, the visible images using information regarding depth acquired based on the structured light images.

In embodiments, gestures inferred may include one-thumb-up; two-thumbs-up; a finger swipe; a two-finger swipe; a three-finger swipe; a four-finger-swipe; a thumb plus one finger swipe; a thumb plus two finger swipe; etc. In embodiments, gestures inferred may include movement of a first digit in a first direction; and of a second digit in a substantially opposite direction. Gestures inferred may include a tickle.

Sensing of the intensity of light incident on an object may be employed in a number of applications. One such application includes estimation of ambient light levels incident upon an object so that the object's own light-emission intensity can be suitable selected. In mobile devices such as cell phones, personal digital assistants, smart phones, and the like, the battery life, and thus the reduction of the consumption of power, are of importance. At the same time, the visual display of information, such as through the use of a display such as those based on LCDs or pixilated LEDs, may also be needed. The intensity with which this visual information is displayed depends at least partially on the ambient illumination of the scene. For example, in very bright ambient lighting, more light intensity generally needs to be emitted by the display in order for the display's visual impression or image to be clearly visible above the background light level. When ambient lighting is weaker, it is feasible to consume less battery power by emitting a lower level of light from the display.

As a result, it is of interest to sense the light level near or in the display region. Existing methods of light sensing often include a single, or a very few, light sensors, often of small area. This can lead to undesired anomalies and errors in the estimation of ambient illumination levels, especially when the ambient illumination of the device of interest is spatially inhomogeneous. For example, shadows due to obscuring or partially obscuring objects may—if they obscure one or a few sensing elements—result in a display intensity that is less bright than desirable under the true average lighting conditions.

Embodiments include realization of a sensor, or sensors, that accurately permit the determination of light levels. Embodiments include at least one sensor realized using solution-processed light-absorbing materials. Embodiments include sensors in which colloidal quantum dot films constitute the primary light-absorbing element. Embodiments include systems for the conveyance of signals relating to the light level impinging on the sensor that reduce, or mitigate, the presence of noise in the signal as it travels over a distance between a passive sensor and active electronics that employ the modulation of electrical signals used in transduction. Embodiments include systems that include (1) the light-absorbing sensing element; (2) electrical interconnect for the conveyance of signals relating to the light intensity impinging upon the sensing element; and (3) circuitry that is remote from the light-absorbing sensing element, and is connected to it via the electrical interconnect, that achieves low-noise conveyance of the sensed signal through the electrical interconnect. Embodiments include systems in which the length of interconnect is more than one centimeter in length. Embodiments include systems in which interconnect does not require special shielding yet achieve practically useful signal-to-noise levels.

Embodiments include sensors, or sensor systems, that are employed, singly or in combination, to estimate the average color temperature illuminating the display region of a computing device. Embodiments include sensors, or sensor systems, that accept light from a wide angular range, such as greater than about ±20° to normal incidence, or greater than about ±30° to normal incidence, or greater than about ±40° to normal incidence. Embodiments include sensors, or sensor systems, that include at least two types of optical filters, a first type passing primarily a first spectral band, a second type passing primarily a second spectral band. Embodiments include using information from at least two sensors employing at least two types of optical filters to estimate color temperature illuminating the display region, or a region proximate the display region.

Embodiments include systems employing at least two types of sensors. Embodiments include a first type constituted of a first light-sensing material, and a second type constituted of a second light-sensing material. Embodiments include a first light-sensing material configured to absorb, and transduce, light in a first spectral band, and a second light-sensing material configured to transduce a second spectral band. Embodiments include a first light-sensing material employing a plurality of nanoparticles having a first average diameter, and a second light-sensing material employing a plurality of nanoparticles have a second average diameter. Embodiments include a first diameter in the range of approximately 1 nm to approximately 2 nm, and a second diameter greater than about 2 nm.

Embodiments include methods of incorporating a light-sensing material into, or onto, a computing device involving ink-jet printing. Embodiments include using a nozzle to apply light-sensing material over a defined region. Embodiments include defining a primary light-sensing region using electrodes. Embodiments include methods of fabricating light sensing devices integrated into, or onto, a computing device involving: defining a first electrode; defining a second electrode; defining a light-sensing region in electrical communication with the first and the second electrode. Embodiments include methods of fabricating light sensing devices integrated into, or onto, a computing device involving: defining a first electrode; defining a light-sensing region; and defining a second electrode; where the light sensing region is in electrical communication with the first and the second electrode.

Embodiments include integration at least two types of sensors into, or onto, a computing device, using ink-jet printing. Embodiments include using a first reservoir containing a first light-sensing material configured to absorb, and transduce, light in a first spectral band; and using a second reservoir containing a second light-sensing material configured to absorb, and transduce, light in a second spectral band.

Embodiments include the use of differential or modulated signaling in order to substantially suppress any external interference. Embodiments include subtracting dark background noise.

Figure 16:
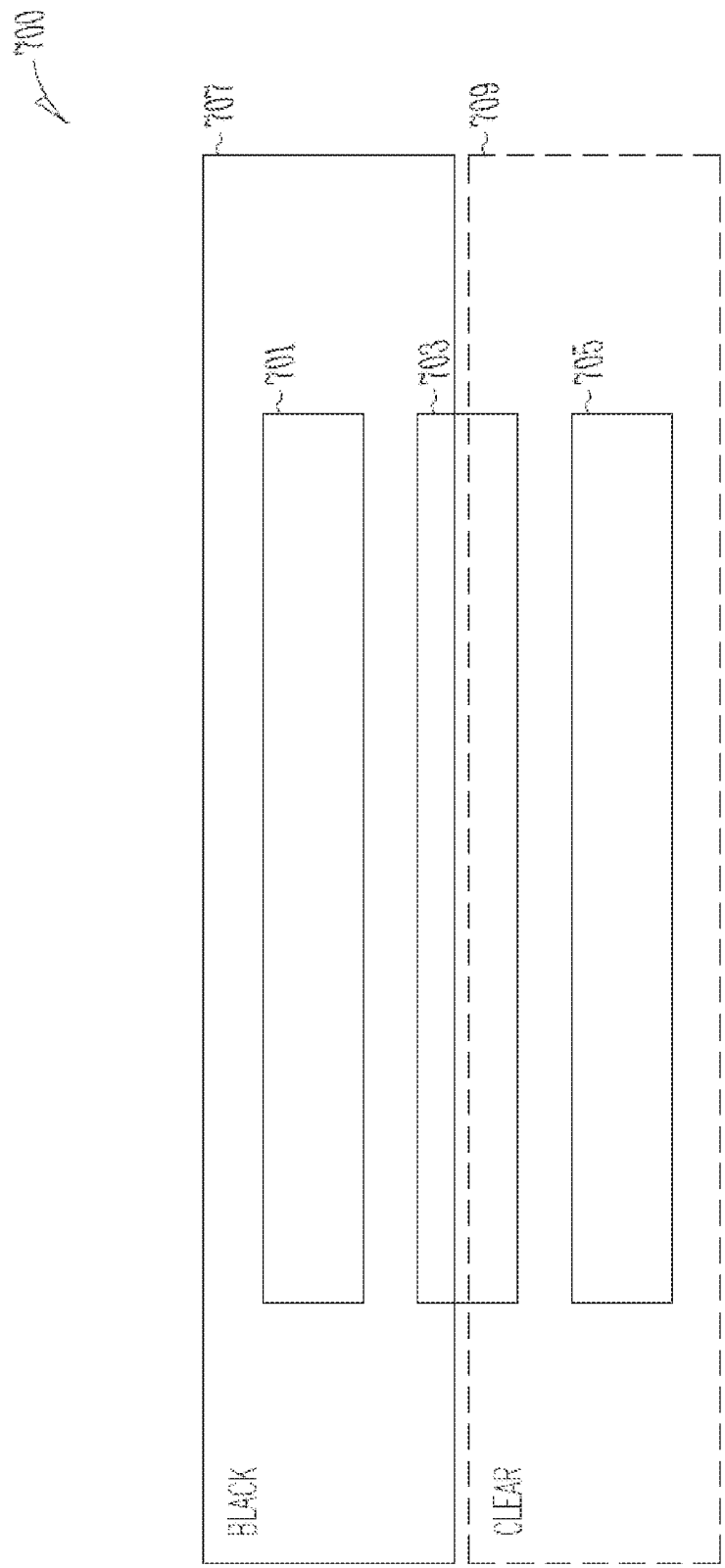
FIG. 16 shows an embodiment of a three-electrode differential-layout system to reduce external interferences with light sensing operations.

Embodiments include a differential system depicted in FIG. 16. FIG. 16 shows an embodiment of a three-electrode differential-layout system 700 to reduce external interferences with light sensing operations. The three-electrode differential-layout system 700 is shown to include a light sensing material covering all three electrodes 701, 703, 705. A light-obscuring material 707 (Black) prevents light from impinging upon the light-sensing material in a region that is electrically accessed using the first electrode 701 and the second electrode 703. A substantially transparent material 709 (Clear) allows light to impinge upon the light-sensing material in a substantially distinct region that is electrically accessed using the second electrode 703 and the third electrode 705. The difference in the current flowing through the Clear-covered electrode pair and the Black-covered electrode pair is equal to the photocurrent—that is, this difference does not include any dark current, but instead is proportional to the light intensity, with any dark offset substantially removed.

Embodiments include the use of a three-electrode system as follows. Each electrode consists of a metal wire. Light-absorbing material may be in electrical communication with the metal wires. Embodiments include the encapsulation of the light-absorbing material using a substantially transparent material that protects the light-absorbing material from ambient environmental conditions such as air, water, humidity, dust, and dirt. The middle of the three electrodes may be biased to a voltage $V_1$, where an example of a typical voltage is about 0 V. The two outer electrodes may be biased to a voltage $V_2$, where a typical value is about 3 V. Embodiments include covering a portion of the device using light-obscuring material that substantially prevents, or reduces, the incidence of light on the light-sensing material.

The light-obscuring material ensures that one pair of electrodes sees little or no light. This pair is termed the dark, or reference, electrode pair. The use of a transparent material over the other electrode pair ensures that, if light is incident, it is substantially incident upon the light-sensing material. This pair is termed the light electrode pair.

The difference in the current flowing through the light electrode pair and the dark electrode pair is equal to the photocurrent—that is, this difference does not include any dark current, but instead is proportional to the light intensity, with any dark offset substantially removed.

Figure 17:
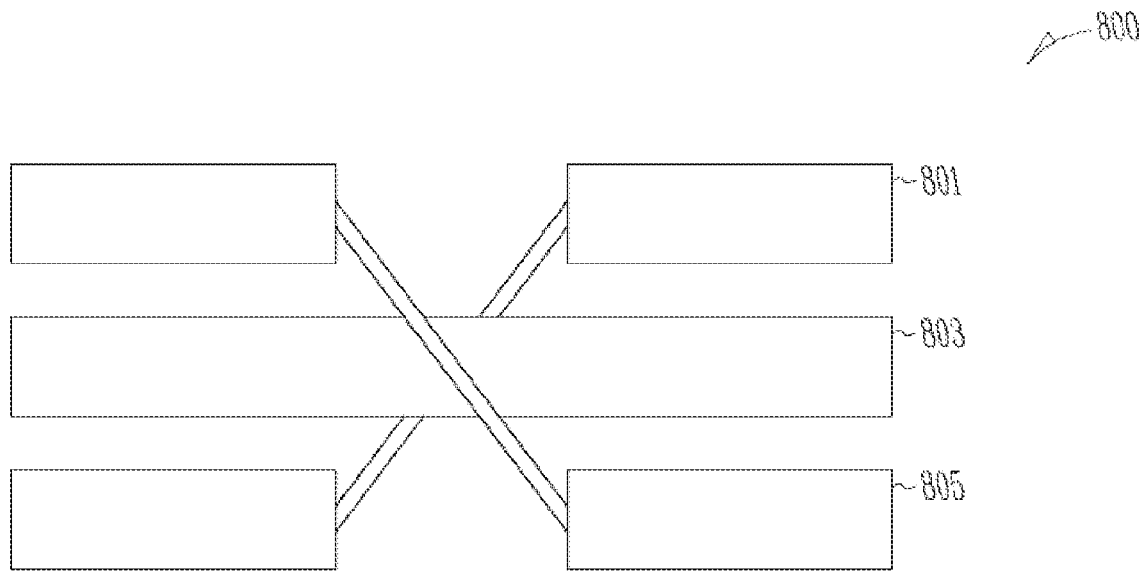
FIG. 17 shows an embodiment of a three-electrode twisted-pair layout system to reduce common-mode noise from external interferences in light sensing operations.

In embodiments, these electrodes are wired in twisted-pair form. In this manner, common-mode noise from external sources is reduced or mitigated. Referring to FIG. 17, electrodes 801, 803, 805 with twisted pair layout 800, the use of a planar analogue of a twisted-pair configuration leads to reduction or mitigation of common-mode noise from external sources.

In another embodiment, biasing may be used such that the light-obscuring layer may not be required. The three electrodes may be biased to three voltages $V_1$, $V_2$, and $V_3$. In one example, $V_1=6$ V, $V_2=3$ V, $V_3=0$ V. The light sensor between 6 V and 3 V, and that between 0 V and 3 V, will generate opposite-direction currents when read between the 6 V and 0 V. The resultant differential signal is then transferred out in twisted-pair fashion.

In embodiments, the electrode layout may itself be twisted, further improving the noise-resistance inside the sensor. In this case, an architecture is used in which an electrode may cross over another.

Figure 18:
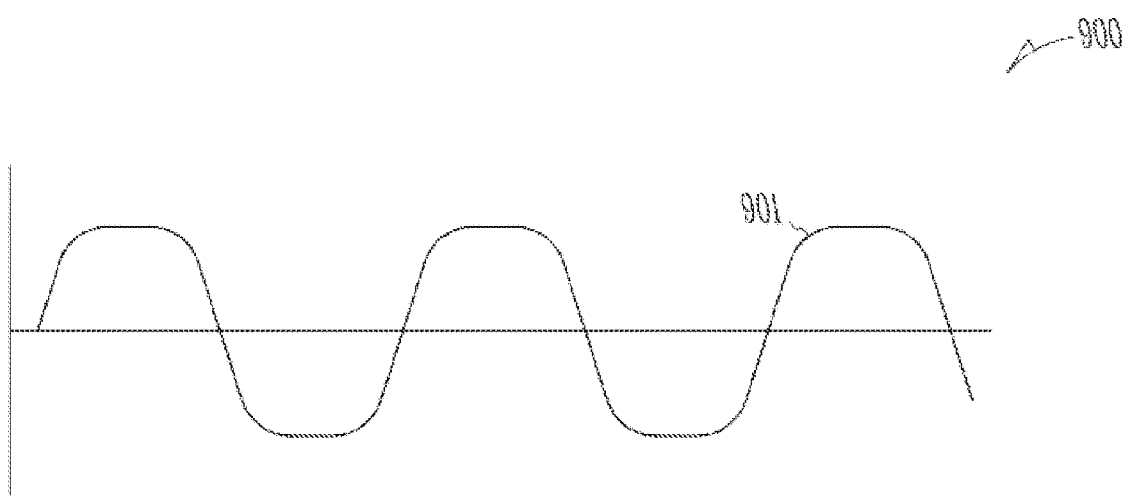
FIG. 18 is an embodiment of time-modulated biasing a signal applied to electrodes to reduce external noise that is not at the modulation frequency.

In embodiments, electrical bias modulation may be employed. An alternating bias may be used between a pair of electrodes. The photocurrent that flows will substantially mimic the temporal evolution of the time-varying electrical biasing. Readout strategies include filtering to generate a low-noise electrical signal. The temporal variations in the biasing include sinusoidal, square, or other periodic profiles. For example, referring to FIG. 18, an embodiment of time-modulated biasing 900 a signal 901 applied to electrodes to reduce external noise that is not at the modulation frequency. Modulating the signal in time allows rejection of external noise that is not at the modulation frequency.

Embodiments include combining the differential layout strategy with the modulation strategy to achieve further improvements in signal-to-noise levels.

Embodiments include employing a number of sensors having different shapes, sizes, and spectral response (e.g., sensitivities to different colors). Embodiments include generating multi-level output signals. Embodiments include processing signals using suitable circuits and algorithms to reconstruct information about the spectral and/or other properties of the light incident.

Advantages of the disclosed subject matter include transfer of accurate information about light intensity over longer distances than would otherwise be possible. Advantages include detection of lower levels of light as a result. Advantages include sensing a wider range of possible light levels. Advantages include successful light intensity determination over a wider range of temperatures, an advantage especially conferred when the dark reference is subtracted using the differential methods described herein.

Embodiments include a light sensor including a first electrode, a second electrode, and a third electrode. A light-absorbing semiconductor is in electrical communication with each of the first, second, and third electrodes. A light-obscuring material substantially attenuates the incidence of light onto the portion of light-absorbing semiconductor residing between the second and the third electrodes, where an electrical bias is applied between the second electrode and the first and third electrodes and where the current flowing through the second electrode is related to the light incident on the sensor.

Embodiments include a light sensor including a first electrode, a second electrode, and a light-absorbing semiconductor in electrical communication with the electrodes wherein a time-varying electrical bias is applied between the first and second electrodes and wherein the current flowing between the electrodes is filtered according to the time-varying electrical bias profile, wherein the resultant component of current is related to the light incident on the sensor.

Embodiments include the above embodiments where the first, second, and third electrodes consists of a material chosen from the list: gold, platinum, palladium, silver, magnesium, manganese, tungsten, titanium, titanium nitride, titanium dioxide, titanium oxynitride, aluminum, calcium, and lead.

Embodiments include the above embodiments where the light-absorbing semiconductor includes materials taken from the list: PbS, PbSe, PbTe, SnS, SnSe, SnTe, CdS, CdSe, CdTe, $Bi_2S_3$, $In_2S_3$, $In_2S_3$, $In_2Te_3$, ZnS, ZnSe, ZnTe, Si, Ge, GaAs, polypyrolle, pentacene, polyphenylenevinylene, polyhexylthiophene, and phenyl-C61-butyric acid methyl ester.

Embodiments include the above embodiments where the bias voltages are greater than about 0.1 V and less than about 10 V. Embodiments include the above embodiments where the electrodes are spaced a distance between about 1 μm and about 20 μm from one another.

Embodiments include the above embodiments where the distance between the light-sensing region and active circuitry used in biasing and reading is greater than about 1 cm and less than about 30 cm.

The capture of visual information regarding a scene, such as via imaging, is desired in a range of areas of application. In cases, the optical properties of the medium residing between the imaging system, and the scene of interest, may exhibit optical absorption, optical scattering, or both. In cases, the optical absorption and/or optical scattering may occur more strongly in a first spectral range compared to a second spectral range. In cases, the strongly-absorbing-or-scattering first spectral range may include some or all of the visible spectral range of approximately 470 nm to approximately 630 nm, and the more-weakly-absorbing-or-scattering second spectral range may include portions of the infrared spanning a range of approximately 650 nm to approximately 24 μm wavelengths.

In embodiments, image quality may be augmented by providing an image sensor array having sensitivity to wavelengths longer than about a 650 nm wavelength.

In embodiments, an imaging system may operate in two modes: a first mode for visible-wavelength imaging; and a second mode for infrared imaging. In embodiments, the first mode may employ a filter that substantially blocks the incidence of light of some infrared wavelengths onto the image sensor.

Figure 19:
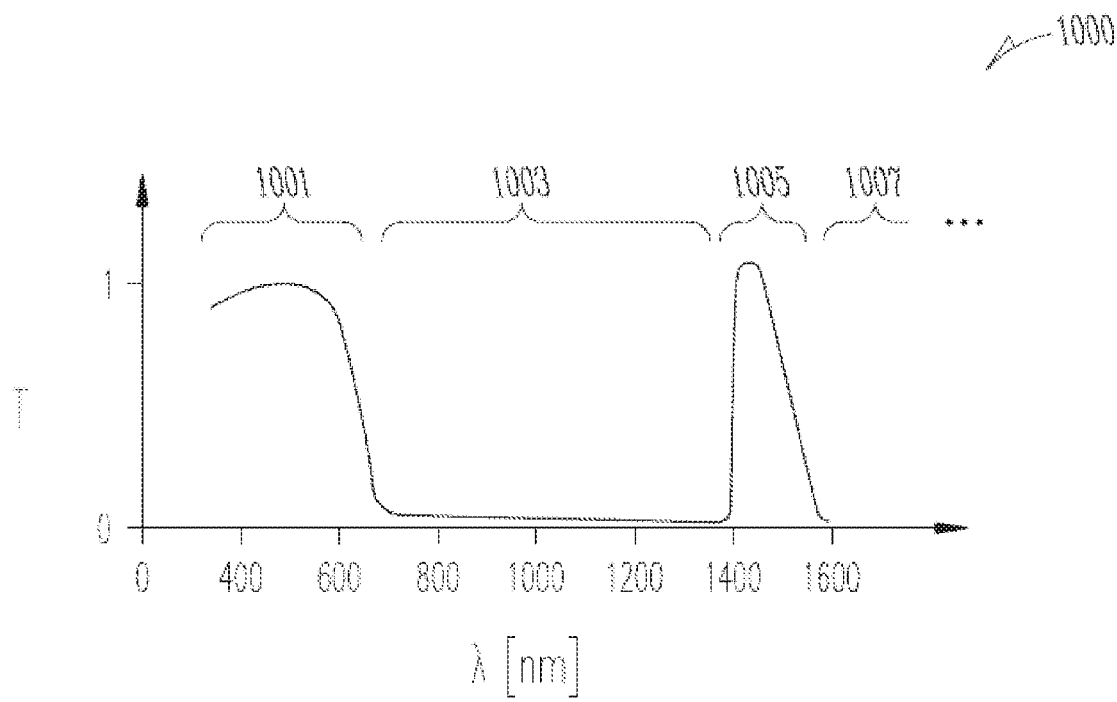
FIG. 19 shows an embodiment of a transmittance spectrum of a filter that may be used in various imaging applications.

Referring now to FIG. 19, an embodiment of a transmittance spectrum 1000 of a filter that may be used in various imaging applications. Wavelengths in the visible spectral region 1001 are substantially transmitted, enabling visible-wavelength imaging. Wavelengths in the infrared bands 1003 of approximately 750 nm to approximately 1450 nm, and also in a region 1007 beyond about 1600 nm, are substantially blocked, reducing the effect of images associated with ambient infrared lighting. Wavelengths in the infrared band 1005 of approximately 1450 nm to approximately 1600 nm are substantially transmitted, enabling infrared-wavelength imaging when an active source having its principal spectral power within this band is turned on.

In embodiments, an imaging system may operate in two modes: a first mode for visible-wavelength imaging; and a second mode for infrared imaging. In embodiments, the system may employ an optical filter, which remains in place in each of the two modes, that substantially blocks incidence of light over a first infrared spectral band; and that substantially passes incidence of light over a second infrared spectral band. In embodiments, the first infrared spectral band that is blocked may span from about 700 nm to about 1450 nm. In embodiments, the second infrared spectral band that is substantially not blocked may begin at about 1450 nm. In embodiments, the second infrared spectral band that is substantially not blocked may end at about 1600 nm. In embodiments, in the second mode for infrared imaging, active illuminating that includes power in the second infrared spectral band that is substantially not blocked may be employed. In embodiments, a substantially visible-wavelength image may be acquired via image capture in the first mode. In embodiments, a substantially actively-infrared-illuminated image may be acquired via image capture in the second mode. In embodiments, a substantially actively-infrared-illuminated image may be acquired via image capture in the second mode aided by the subtraction of an image acquired during the first mode. In embodiments, a periodic-in-time alternation between the first mode and second mode may be employed. In embodiments, a periodic-in-time alternation between no-infrared-illumination, and active-infrared-illumination, may be employed. In embodiments, a periodic-in-time alternation between reporting a substantially visible-wavelength image, and reporting a substantially actively-illuminated-infrared image, may be employed. In embodiments, a composite image may be generated which displays, in overlaid fashion, information relating to the visible-wavelength image and the infrared-wavelength image. In embodiments, a composite image may be generated which uses a first visible-wavelength color, such as blue, to represent the visible-wavelength image; and uses a second visible-wavelength color, such as red, to represent the actively-illuminated infrared-wavelength image, in a manner that is overlaid.

In image sensors, a nonzero, nonuniform, image may be present even in the absence of illumination, (in the dark). If not accounted for, the dark images can lead to distortion and noise in the presentation of illuminated images.

In embodiments, an image may be acquired that represents the signal present in the dark. In embodiments, an image may be presented at the output of an imaging system that represents the difference between an illuminated image and the dark image. In embodiments, the dark image may be acquired by using electrical biasing to reduce the sensitivity of the image sensor to light. In embodiments, an image sensor system may employ a first time interval, with a first biasing scheme, to acquire a substantially dark image; and a second time interval, with a second biasing scheme, to acquire a light image. In embodiments, the image sensor system may store the substantially dark image in memory; and may use the stored substantially dark image in presenting an image that represents the difference between a light image and a substantially dark image. Embodiments include reducing distortion, and reducing noise, using the method.

In embodiments, a first image may be acquired that represents the signal present following reset; and a second image may be acquired that represents the signal present following an integration time; and an image may be presented that represents the difference between the two images. In embodiments, memory may be employed to store at least one of two of the input images. In embodiments, the result difference image may provide temporal noise characteristics that are consistent with correlated double-sampling noise. In embodiments, an image may be presented having equivalent temporal noise considerable less than that imposed by sqrt(kTC) noise.

Embodiments include high-speed readout of a dark image; and of a light image; and high-speed access to memory and high-speed image processing; to present a dark-subtracted image to a user rapidly.

Embodiments include a camera system in which the interval between the user indicating that an image is to be acquired; and in which the integration period associated with the acquisition of the image; is less than about one second. Embodiments include a camera system that includes a memory element in between the image sensor and the processor.

Embodiments include a camera system in which the time in between shots is less than about one second.

Embodiments include a camera system in which a first image is acquired and stored in memory; and a second image is acquired; and a processor is used to generate an image that employs information from the first image and the second image. Embodiments include generating an image with high dynamic range by combining information from the first image and the second image. Embodiments include a first image having a first focus; and a second image having a second focus; and generating an image from the first image and the second image having higher equivalent depth of focus.

Hotter objects generally emit higher spectral power density at shorter wavelengths than do colder objects. Information may thus be extracted regarding the relative temperatures of objects imaged in a scene based on the ratios of power in a first band to the power in a second band.

In embodiments, an image sensor may comprise a first set of pixels configured to sense light primarily within a first spectral band; and a second set of pixels configured to sense light primarily within a second spectral band. In embodiments, an inferred image may be reported that combines information from proximate pixels of the first and second sets. In embodiments, an inferred image may be reported that provides the ratio of signals from proximate pixels of the first and second sets.

In embodiments, an image sensor may include a means of estimating object temperature; and may further include a means of acquiring visible-wavelength images. In embodiments, image processing may be used to false-color an image representing estimated relative object temperature atop a visible-wavelength image.

In embodiments, the image sensor may include at least one pixel having linear dimensions less than approximately 2 μm×2 μm.

In embodiments, the image sensor may include a first layer providing sensing in a first spectral band; and a second layer providing sensing in a second spectral band.

In embodiments, visible images can be used to present a familiar representation to users of a scene; and infrared images can provide added information, such as regarding temperature, or pigment, or enable penetration through scattering and/or visible-absorbing media such as fog, haze, smoke, or fabrics.

In cases, it may be desired to acquire both visible and infrared images using a single image sensor. In cases, registration among visible and infrared images is thus rendered substantially straightforward.

In embodiments, an image sensor may employ a single class of light-absorbing light-sensing material; and may employ a patterned layer above it that is responsible for spectrally-selective transmission of light through it, also known as a filter. In embodiments, the light-absorbing light-sensing material may provide high-quantum-efficiency light sensing over both the visible and at least a portion of the infrared spectral regions. In embodiments, the patterned layer may enable both visible-wavelength pixel regions, and also infrared-wavelength pixel regions, on a single image sensor circuit.

In embodiments, an image sensor may employ two classes of light-absorbing light-sensing materials: a first material configured to absorb and sense a first range of wavelengths; and a second material configured to absorb and sense a second range of wavelengths. The first and second ranges may be at least partially overlapping, or they may not be overlapping.

In embodiments, two classes of light-absorbing light-sensing materials may be placed in different regions of the image sensor. In embodiments, lithography and etching may be employed to define which regions are covered using which light-absorbing light-sensing materials. In embodiments, ink-jet printing may be employed to define which regions are covered using which light-absorbing light-sensing materials.

In embodiments, two classes of light-absorbing light-sensing materials may be stacked vertically atop one another. In embodiments, a bottom layer may sense both infrared and visible light; and a top layer may sense visible light principally.

In embodiments, an optically-sensitive device may include: a first electrode; a first light-absorbing light-sensing material; a second light-absorbing light-sensing material; and a second electrode. In embodiments, a first electrical bias may be provided between the first and second electrodes such that photocarriers are efficiently collected primarily from the first light-absorbing light-sensing material. In embodiments, a second electrical bias may be provided between the first and second electrodes such that photocarriers are efficiently collected primarily from the second light-absorbing light-sensing material. In embodiments, the first electrical bias may result in sensitivity primarily to a first wavelength of light. In embodiments, the second electrical bias may result in sensitivity primarily to a second wavelength of light. In embodiments, the first wavelength of light may be infrared; and the second wavelength of light may be visible. In embodiments, a first set of pixels may be provided with the first bias; and a second set of pixels may be provided with the second bias; ensuring that the first set of pixels responds primarily to a first wavelength of light, and the second set of pixels responds primarily to a second wavelength of light.

In embodiments, a first electrical bias may be provided during a first period of time; and a second electrical bias may be provided during a second period of time; such that the image acquired during the first period of time provides information primarily regarding a first wavelength of light; and the image acquired during the second period of time provides information primarily regarding a second wavelength of light. In embodiments, information acquired during the two periods of time may be combined into a single image. In embodiments, false-color may be used to represent, in a single reported image, information acquired during each of the two periods of time.

In embodiments, a focal plane array may consist of a substantially laterally-spatially uniform film having a substantially laterally-uniform spectral response at a given bias; and having a spectral response that depends on the bias. In embodiments, a spatially nonuniform bias may be applied, for example, different pixel regions may bias the film differently. In embodiments, under a given spatially-dependent biasing configuration, different pixels may provide different spectral responses. In embodiments, a first class of pixels may be responsive principally to visible wavelengths of light, while a second class of pixels may be responsive principally to infrared wavelengths of light. In embodiments, a first class of pixels may be responsive principally to one visible-wavelength color, such as blue; and a second class of pixels may be responsive principally to a distinctive visible-wavelength color, such as green; and a third class of pixels may be responsive principally to a distinctive visible-wavelength color, such as red.

In embodiments, an image sensor may comprise a readout integrated circuit, at least one pixel electrode of a first class, at least one pixel electrode of a second class, a first layer of optically sensitive material, and a second layer of optically sensitive material. In embodiments, the image sensor may employ application of a first bias for the first pixel electrode class; and of a second bias to the second pixel electrode class.

In embodiments, those pixel regions corresponding to the first pixel electrode class may exhibit a first spectral response; and of the second pixel electrode class may exhibit a second spectral response; where the first and second spectral responses are significantly different. In embodiments, the first spectral response may be substantially limited to the visible-wavelength region. In embodiments, the second spectral response may be substantially limited to the visible-wavelength region. In embodiments, the second spectral response may include both portions of the visible and portions of the infrared spectral regions.

In embodiments, it may be desired to fabricate an image sensor having high quantum efficiency combined with low dark current.

In embodiments, a device may consist of: a first electrode; a first selective spacer; a light-absorbing material; a second selective spacer; and a second electrode.

In embodiments, the first electrode may be used to extract electrons. In embodiments, the first selective spacer may be used to facilitate the extraction of electrons but block the injection of holes. In embodiments, the first selective spacer may be an electron-transport layer. In embodiments, the light-absorbing material may include semiconductor nanoparticles. In embodiments, the second selective spacer may be used to facilitate the extraction of holes but block the injection of electrons. In embodiments, the second selective spacer may be a hole-transport layer.

In embodiments, only a first selective spacer may be employed. In embodiments, the first selective spacer may be chosen from the list: $TiO_2$, ZnO, and ZnS. In embodiments, the second selective spacer may be NiO. In embodiments, the first and second electrode may be made using the same material. In embodiments, the first electrode may be chosen from the list: TiN, W, Al, and Cu. In embodiments, the second electrode may be chosen from the list: ZnO, Al:ZnO, ITO, $MoO_3$, Pedot, and Pedot:PSS.

In embodiments, it may be desired to implement an image sensor in which the light-sensing element can be configured during a first interval to accumulate photocarriers; and during a second interval to transfer photocarriers to another node in a circuit.

Embodiments include a device comprising: a first electrode; a light sensing material; a blocking layer; and a second electrode.

Embodiments include electrically biasing the device during a first interval, known as the integration period, such that photocarriers are transported towards the first blocking layer; and where photocarriers are stored near the interface with the blocking layer during the integration period.

Embodiments include electrically biasing the device during a second interval, known as the transfer period, such that the stored photocarriers are extracted during the transfer period into another node in a circuit.

Embodiments include a first electrode chosen from the list: TiN, W, Al, Cu. In embodiments, the second electrode may be chosen from the list: ZnO, Al:ZnO, ITO, MoO3, Pedot, and Pedot:PSS. In embodiments, the blocking layer be chosen from the list: $HfO_2$, $Al_2O_3$, NiO, $TiO_2$, and ZnO.

In embodiments, the bias polarity during the integration period may be opposite to that during the transfer period. In embodiments, the bias during the integration period may be of the same polarity as that during the transfer period. In embodiments, the amplitude of the bias during the transfer period may be greater than that during the integration period.

Embodiments include a light sensor in which an optically sensitive material functions as the gate of a silicon transistor. Embodiments include devices comprising: a gate electrode coupled to a transistor; an optically sensitive material; a second electrode. Embodiments include the accumulation of photoelectrons at the interface between the gate electrode and the optically sensitive material. Embodiments include the accumulation of photoelectrons causing the accumulation of holes within the channel of the transistor. Embodiments include a change in the flow of current in the transistor as a result of a change in photoelectrons as a result of illumination. Embodiments include a change in current flow in the transistor greater than 1000 electrons/s for every electron/s of change in the photocurrent flow in the optically sensitive layer. Embodiments include a saturation behavior in which the transistor current versus photons impinged transfer curve has a sublinear dependence on photon fluence, leading to compression and enhanced dynamic range. Embodiments include resetting the charge in the optically sensitive layer by applying a bias to a node on the transistor that results in current flow through the gate during the reset period.

Embodiments include combinations of the above image sensors, camera systems, fabrication methods, algorithms, and computing devices, in which at least one image sensor is capable of operating in global electronic shutter mode.

In embodiments, at least two image sensors, or image sensor regions, may each operate in global shutter mode, and may provide substantially synchronous acquisition of images of distinct wavelengths, or from different angles, or employing different structured light.

Figure 20:
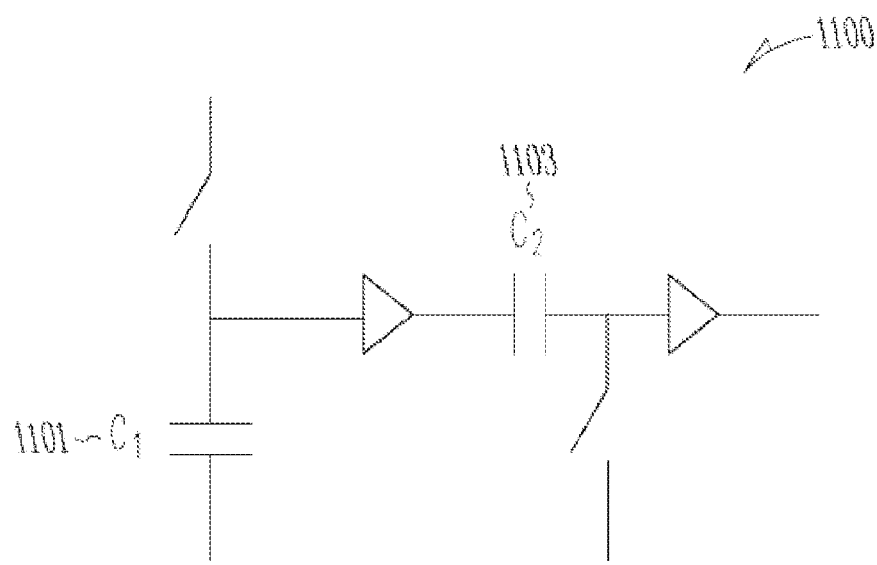
FIG. 20 shows an example schematic diagram of a circuit that may be employed within each pixel to reduce noise power.

Embodiments include implementing correlated double-sampling in the analog domain. Embodiments include so doing using circuitry contained within each pixel. FIG. 20 shows an example schematic diagram of a circuit 1100 that may be employed within each pixel to reduce noise power. In embodiments, a first capacitor 1101 ($C_1$) and a second capacitor 1103 ($C_2$) are employed in combination as shown. In embodiments, the noise power is reduced according to the ratio $C_2/C_1$.

Figure 21:
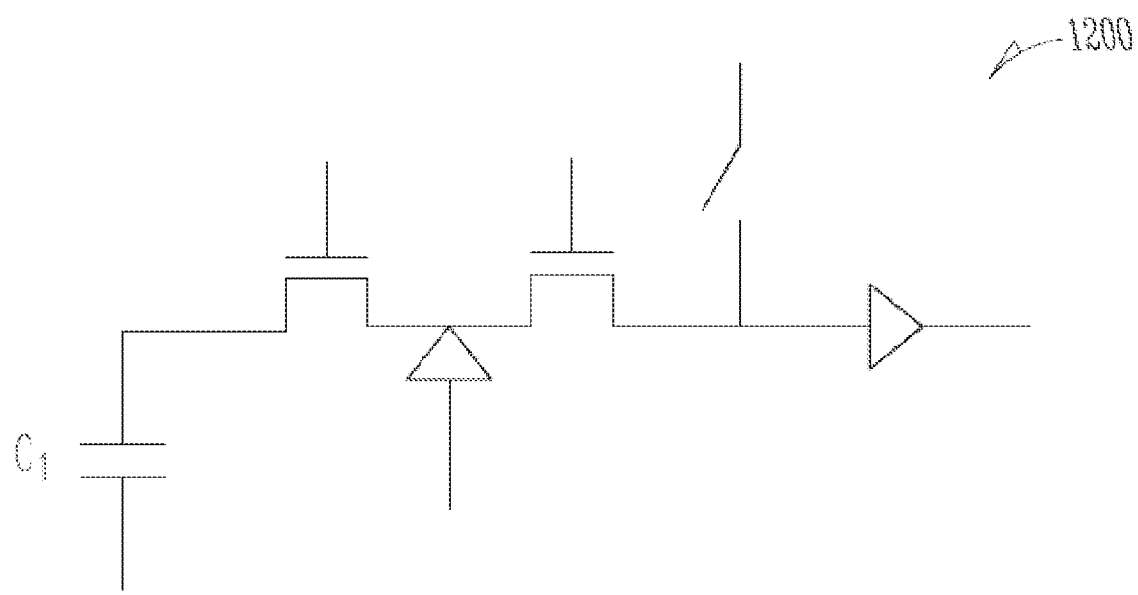
FIG. 21 shows an example schematic diagram of a circuit of a photoGate/pinned-diode storage that may be implemented in silicon.

FIG. 21 shows an example schematic diagram of a circuit 1200 of a photoGate/pinned-diode storage that may be implemented in silicon. In embodiments, the photoGate/pinned-diode storage in silicon is implemented as shown. In embodiments, the storage pinned diode is fully depleted during reset. In embodiments, $C_1$ (corresponding to the light sensor's capacitance, such as quantum dot film in embodiments) sees a constant bias.

In embodiments, light sensing may be enabled through the use of a light sensing material that is integrated with, and read using, a readout integrated circuit. Example embodiments of same are included in U.S. Provisional Application No. 61/352,409, entitled, "Stable, Sensitive Photodetectors and Image Sensors Made Therefrom Including Circuits for Enhanced Image Performance," and U.S. Provisional Application No. 61/352,410, entitled, "Stable, Sensitive Photodetectors and Image Sensors Made Therefrom Including Processes and Materials for Enhanced Image Performance," both filed Jun. 8, 2010, which are hereby incorporated by reference in their entirety.

In embodiments, a method of gesture recognition is provided where the method includes acquiring a stream, in time, of at least two images from each of at least one camera module; acquiring a stream, in time, of at least two signals from each of at least one light sensor; and conveying the at least two images and the at least two signals to a processor, the processor being configured to generate an estimate of a gesture's meaning, and timing, based on a combination of the at least two images and the at least two signals.

In embodiments, the at least one light sensor includes a light-absorbing material having an absorbance, across the visible wavelength region of about 450 nm to about 650 nm, of less than about 30%.

In embodiments, the light-absorbing material includes PBDTT-DPP, the near-infrared light-sensitive polymer poly (2,60-4,8-bis(5-ethylhexylthienyl)benzo-[1,2-b;3,4-b]dithiophene-alt-5-dibutyloctyl-3,6-bis(5-bromothiophen-2-yl) pyrrolo[3,4-c]pyrrole-1,4-dione).

In embodiments, the at least one light sensor includes a light-sensing material capable of sensing infrared light.

In embodiments, the method includes modulating a light source using at least one code selected from spatial codes and temporal codes.

In embodiments, the light source has an emission wavelength in the range of about 900 nm to about 1000 nm.

In one embodiment, a camera system includes a central imaging array region, at least one light-sensing region outside of the central imaging array region, a first mode, referred to as imaging mode, and a second mode, referred to as sensing mode. The electrical power consumed in the second mode is at least 10 times lower than the electrical power consumed in the first mode.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 µm in width and approximately 2 µm in height.

In one embodiment, an image sensor circuit includes a central imaging array region having a first field of view; and at least one light-sensing region outside of the central imaging array region having a second field of view. The second field of view is less than half, measured in angle, the field of view of the first field of view.

In one embodiment, an integrated circuit includes a substrate, an image sensing array region occupying a first region of said semiconductor substrate and including a plurality of optically sensitive pixel regions, a pixel circuit for each pixel region, each pixel circuit comprising a charge store and a read-out circuit, and a light-sensitive region outside of the image sensing array region. The image sensing array region having a first field of view and the light-sensitive region having a second field of view; the angle of the second field of view is less than half of the angle of the first field of view.

In embodiments, at least one of the image sensing array and the light-sensitive region outside of the image sensing array region includes a light-sensing material capable of sensing infrared light.

In embodiments, light impinging on at least one of the image sensing array and the light-sensitive region outside of the image sensing array region is to be modulated.

In embodiments, a portion of light impinging on at least one of the image sensing array and the light-sensitive region outside of the image sensing array region is to be generated using a light emitter device having an emission wavelength in the range of about 800 nm to about 1000 nm.

In embodiments, the image sensing array includes at least six megapixels.

In embodiments, the image sensing array comprises pixels less than approximately 2 µm in width and approximately 2 µm in height.

In one embodiment, an image sensor includes a central imaging array region to provide pixelated sensing of an image, in communication with a peripheral region that includes circuitry to provide biasing, readout, analog-to-digital conversion, and signal conditioning to the pixelated light sensing region. An optically sensitive material overlies the peripheral region.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 µm in width and approximately 2 µm in height.

In embodiments, the optically sensitive material is chosen to include at least one material from a list, the list including silicon, colloidal quantum dot film, and a semiconducting polymer.

In embodiments, the optically sensitive material is fabricated on a first substrate, and is subsequently incorporated onto the central imaging array region.

A person of ordinary skill in the art will appreciate that, for this and other processing methods and devices disclosed herein, the activities forming part of various methods may, in certain cases, be implemented in a differing order, as well as repeated, executed simultaneously, or substituted one for another. Further, the outlined acts and operations are only provided as examples, and some of the acts and operations may be optional, combined into fewer acts and operations, or expanded into additional acts and operations without detracting from the essence of the disclosed embodiments. Also, various ones of the embodiments may be combined together or used separately.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The various illustrations of the procedures and apparatuses are intended to provide a general understanding of the structure of various embodiments and are not intended to provide a complete description of all the elements and features of the apparatuses and methods that might make use of the structures, features, and materials described herein. Based upon a reading and understanding of the disclosed subject matter provided herein, a person of ordinary skill in the art can readily envision other combinations and permutations of the various embodiments. The additional combinations and permutations are all within a scope of the disclosed subject matter.

The Abstract of the disclosure is provided to allow the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method of making an image sensor, the method comprising:
    producing an integrated circuit including trenches of a first depth defining a first class of pixel regions and trenches of a second depth defining a second class of pixel regions;
    overcoating the trenched integrated circuit with a substantially planarizing optically sensitive material such that a difference in the thickness of the optically sensitive material in different regions overlying the integrated circuit is substantially defined by a difference in the first and the second trench depths; and
    producing first and second pixel electrodes in communication with the optically sensitive material in the first and second classes of pixel regions, respectively, and configured to sense a current flowing from the optically sensitive material due to radiation incident thereon.

2. The method of claim 1, wherein the first pixel region is configured to detect light in a first spectral band, and the second pixel region is configured to detect light in a second spectral band.

3. The method of claim 2, wherein the first and second spectral bands include an overlapping spectral range, and the second spectral band also includes a spectral range that is substantially undetectable by the first pixel region.

4. The method of claim 1, wherein the optically sensitive material comprises at least one semiconductor nanoparticle.

* * * * *